United States Patent
Hagiwara

(10) Patent No.: US 7,965,387 B2
(45) Date of Patent: Jun. 21, 2011

(54) IMAGE PLANE MEASUREMENT METHOD, EXPOSURE METHOD, DEVICE MANUFACTURING METHOD, AND EXPOSURE APPARATUS

(75) Inventor: Tsuneyuki Hagiwara, Tokyo (JP)

(73) Assignee: Nikon Corporation, Tokyo (JP)

( * ) Notice: Subject to any disclaimer, the term of this patent is extended or adjusted under 35 U.S.C. 154(b) by 745 days.

(21) Appl. No.: 11/658,034

(22) PCT Filed: Jul. 21, 2005

(86) PCT No.: PCT/JP2005/013350
§ 371 (c)(1),
(2), (4) Date: Feb. 27, 2007

(87) PCT Pub. No.: WO2006/009188
PCT Pub. Date: Jan. 26, 2006

(65) Prior Publication Data
US 2007/0260419 A1  Nov. 8, 2007

(30) Foreign Application Priority Data
Jul. 23, 2004 (JP) ................................. 2004-215593

(51) Int. Cl.
*G01N 21/00* (2006.01)
(52) U.S. Cl. .................................................. 356/237.5
(58) Field of Classification Search ................ 356/237.5
See application file for complete search history.

(56) References Cited

U.S. PATENT DOCUMENTS

| | | | | |
|---|---|---|---|---|
| 4,473,293 A | * | 9/1984 | Phillips | 355/53 |
| 4,573,791 A | * | 3/1986 | Phillips | 355/77 |
| 5,243,195 A | * | 9/1993 | Nishi | 250/548 |
| 5,448,332 A | | 9/1995 | Sakakibara et al. | |
| 5,631,731 A | * | 5/1997 | Sogard | 356/121 |
| 5,646,413 A | | 7/1997 | Nishi | |
| 5,841,520 A | | 11/1998 | Taniguchi | |
| 6,310,680 B1 | | 10/2001 | Taniguchi | |

(Continued)

FOREIGN PATENT DOCUMENTS

JP     A 06-283403     10/1994

(Continued)

OTHER PUBLICATIONS

Office Action issued in Japanese Patent Application No. 2006-529261; mailed Aug. 11, 2010; with English-language translation.

(Continued)

*Primary Examiner* — Roy Punnoose
(74) *Attorney, Agent, or Firm* — Oliff & Berridge, PLC

(57) ABSTRACT

A main controller moves a reticle stage in a scanning direction, illuminates an area on a reticle including a mark area in which predetermined marks are formed with illumination light, forms an aerial image of at least one mark existing in the mark area via a projection optical system, and measures the aerial image using an aerial image measuring unit. The main controller repeatedly performs such aerial image measurement while moving the reticle stage in the scanning direction. Then, the main controller computes a scanning image plane on which an image of a pattern formed on a reticle is formed by the projection optical system, based on the measurement result of the aerial image of each mark at each movement position. Based on the computation result, the main controller performs focus leveling control of a wafer during scanning exposure. Thus, highly accurate exposure is realized without using a sensor for reticle (mask) position measurement.

30 Claims, 11 Drawing Sheets

U.S. PATENT DOCUMENTS

| | | |
|---|---|---|
| 6,549,271 B2 | 4/2003 | Yasuda et al. |
| 6,992,780 B2 * | 1/2006 | Sentoku et al. .............. 356/620 |
| 7,148,973 B2 * | 12/2006 | Sentoku et al. .............. 356/620 |
| 2002/0041377 A1 * | 4/2002 | Hagiwara et al. ............. 356/399 |
| 2002/0176096 A1 * | 11/2002 | Sentoku et al. .............. 356/620 |
| 2003/0128344 A1 * | 7/2003 | Nishi .............................. 355/52 |

FOREIGN PATENT DOCUMENTS

| | | | | |
|---|---|---|---|---|
| JP | A 07-176468 | | | 7/1995 |
| JP | A-9-115820 | | | 5/1997 |
| JP | A-10-172878 | | | 6/1998 |
| JP | 10294268 | A | * | 11/1998 |
| JP | A 10-294268 | | | 11/1998 |
| JP | A 11-026345 | | | 1/1999 |
| JP | A 11-045846 | | | 2/1999 |
| JP | A-2001-035782 | | | 2/2001 |
| JP | 2002195912 | A | * | 7/2002 |
| JP | A 2002-195912 | | | 7/2002 |
| JP | A 2002-198303 | | | 7/2002 |
| JP | 2004014876 | A | * | 1/2004 |
| JP | A 2004-014876 | | | 1/2004 |
| WO | WO 99/49504 | | | 9/1999 |
| WO | WO 03/065428 | A1 | | 8/2003 |
| WO | WO 2004/053955 | A1 | | 6/2004 |
| WO | WO 2004/059710 | A1 | | 7/2004 |

OTHER PUBLICATIONS

Written Opinion of the International Searching Authority issued in International Patent Application No. PCT/JP2005/013350; mailed Nov. 1, 2005; with English-language translation.

Jan. 12, 2011 Notice of Allowance issued in Japanese Patent Application No. 2006-529261 with English translation.

* cited by examiner

IMAGE PLANE MEASUREMENT METHOD, EXPOSURE METHOD, DEVICE MANUFACTURING METHOD, AND EXPOSURE APPARATUS

TECHNICAL FIELD

The present invention relates to image plane measurement methods, exposure methods, device manufacturing methods, and exposure apparatuses, more particularly to an image plane measurement method in which a scanning image plane, on which an image of a pattern formed on a mask mounted on a mask stage movable in a predetermined scanning direction is formed by a projection optical system, is measured, an exposure method including the image plane measurement method, a device manufacturing method using the exposure method, and an exposure apparatus suitable for implementing the exposure method.

BACKGROUND ART

In a lithography process for manufacturing semiconductor devices (integrated circuits), liquid crystal display devices, thin film magnetic heads or the like, conventionally full field and static exposure type projection exposure apparatuses such as a reduction projection exposure apparatus by a step-and-repeat method (a so-called stepper) have been mainly used. However, in recent years, with higher integration of semiconductor devices, scanning exposure apparatuses such as a projection exposure apparatus by a step-and-scan method (a so-called scanning stepper (also called a scanner)) have been used relatively frequently.

In the conventional stepper and scanner, design of the apparatus has been done on the assumption that deformation of a mask or a reticle (hereinafter generally referred to as a "reticle") on which a circuit pattern is formed occurring when the reticle is sucked on a reticle holder (a platen), is similar regardless of the reticle.

However, since a resolving power close to the limitation is required in a projection optical system of this type of projection exposure apparatus, numerical aperture (NA) of the projection optical system is set to a large value in order to enhance the resolving power, and it results in a considerably shallow depth of focus (DOF). In other words, due to a narrower DOF associated with a higher NA of the projection optical system in recent years, image-forming error caused by deformation of a reticle has gradually become measurable.

That is, when a pattern surface of a reticle bends to a projection optical system side substantially evenly, the average position of an image plane also reduces, and therefore, defocus occurs when a target position of a wafer in an optical axis direction of the projection optical system is the same as that in the case where the pattern surface does not bend. Further, when the pattern surface of a reticle is deformed, a position of the pattern on the pattern surface in a direction perpendicular to the optical axis of the projection optical system also changes in some cases, so that such lateral shift of the pattern becomes a factor of distortion error. Therefore, more precise control of reticle flatness level has been required.

As the deformation of a reticle, (a) bending by self-weight, (b) deformation at the time of polishing a glass substrate itself of the reticle, (c) deformation that occurs due to the difference in flatness level between both contact surfaces of the reticle and the reticle holder (the platen) when the reticle is forcibly held on the holder by suction, and the like are considered. Since such deformation state of the reticle varies depending on each reticle, and furthermore, depending on each reticle holder of an exposure apparatus, it is necessary to measure a deformation amount of the reticle in a state where the reticle is actually held on the reticle holder of the exposure apparatus by suction in order to accurately measure the amount.

Then, to quickly measure a surface shape of a reticle, it can be considered to place a positional sensor similar to a focal point detection system (an AF sensor) by an oblique incident method for detecting the position of a wafer in the optical axis direction of the projection optical system, on a reticle stage side.

In this case, since the pattern surface of the reticle is a lower surface, that is, a surface on the projection optical system side, the positional sensor by the oblique incident method is placed in a space between the reticle stage and the projection optical system, or in the vicinity of the space. Particularly in the scanning exposure apparatus, the reticle stage needs to maintain sufficient rigidity to prevent it from being deformed even when stress is applied when accelerating and decelerating for the purpose of synchronous scanning. Therefore, in many cases, the reticle stage takes a constitution having sufficient thickness to the limit where it almost contacts the projection optical system. Furthermore, since the designing of the projection optical system is easier when the space between the reticle and the projection optical system is narrower, the space between the reticle and the projection optical system tends to be even narrower with higher accuracy of the projection optical system. Accordingly, it has become difficult to place a positional sensor for reticle between the projection optical system and the reticle.

In view of such points, even in the case the space between the stage on the reticle side and the projection optical system is narrow and it is difficult to install a sensor for measuring the shape of the pattern surface of the reticle in the space, a scanning exposure method and a scanning exposure apparatus that can measure the shape of the pattern surface and obtains good image-forming characteristics have been suggested (refer to Patent Document 1, 2, 3 and the like).

However, in the scanning exposure method and the scanning exposure apparatus according to Patent Documents 1 to 3, a positional sensor on the reticle side (a reticle AF sensor) is essential, and the space for placing the AF sensor is necessary in the vicinity of the projection optical system although it may not be directly above the projection optical system, which results in an insufficient degree of freedom in design of the projection optical system and the reticle stage.

[Patent Document 1] Kokai (Japanese Unexamined Patent Application Publication) No. 11-045846 publication
[Patent Document 2] Kokai (Japanese Unexamined Patent Application Publication) No. 11-026345
[Patent Document 3] U.S. Pat. No. 6,549,271

DISCLOSURE OF INVENTION

Means for Solving the Problems

The present invention has been made in consideration of the situation described above, and according to a first aspect of the present invention, there is provided an image plane measurement method in which a scanning image plane, on which an image of a pattern formed on a mask mounted on a mask stage that is movable in a predetermined scanning direction is formed by a projection optical system, is measured, the method comprising: an aerial image measurement process in which while moving the mask stage in the scanning direction, at each movement position, an area on the mask including a mark area on which predetermined marks are formed is illuminated with illumination light, an aerial image of at least one mark existing in the mark area is formed via the projection optical system, and the aerial image is measured using an aerial image measuring unit; and a computation process in which the scanning image plane is computed based on the measurement result of the aerial image of the mark at the each movement position.

Herein, the "scanning image plane" means an image plane on which an image of a pattern formed on the mask mounted on the mask stage movable in a predetermined scanning direction is formed by the projection optical system. Accordingly, it includes not only the curvature of image plane due to design residual errors and manufacturing errors of the projection optical system itself, but also flatness level errors of the mask (including irregularity errors by deformation), mask vertical movement associated with the scanning direction positional change of the mask stage, and the fluctuation of an image plane position caused by pitching and rolling.

With this method, the mask stage is moved in the scanning direction, the area on the mask including the mark area in which predetermined marks are formed is illuminated with illumination light, an aerial image of at least one mark existing in the mark area is formed via the projection optical system, and the aerial image is measured using the aerial image measuring unit. Such measurement of the aerial image is repeatedly performed while moving the mask stage in the scanning direction. Then, the scanning image plane is computed based on the measurement result of the aerial image of each mark at each movement position. In other words, since not the pattern surface of the mask but the scanning image plane on which the pattern surface is projected is measured, a sensor for measuring mask position is not necessary, and also it is not necessary to secure the space for installing the sensor for measuring mask position between the mask and the projection optical system. Accordingly, the degree of freedom in design of the projection optical system increases and a high-performance projection optical system can be realized.

In this case, the aerial image measurement process can include a process in which positional information on the aerial images of the marks in the optical axis direction of the projection optical system is measured, and a process in which positional information on the aerial images of the marks in a direction within a plane perpendicular to the optical axis of the projection optical system is measured.

According to a second aspect of the present invention, there is provided an exposure method in which a mask stage on which a mask is mounted and an object are synchronously moved with respect to illumination light and a pattern formed on the mask is transferred onto the object, the method comprising: a measurement process in which a scanning image plane on which an image of a pattern formed on the mask is formed by a projection optical system is measured using the image plane measurement method of the present invention; and a correction process in which correction is performed so as to draw the scanning image plane and a surface of the object closer to each other based on the measurement result of the scanning image plane, when the pattern is transferred.

With this method, by the image plane measurement method of the present invention, the scanning image plane on which an image of the pattern formed on the mask is formed by the projection optical system is measured, and correction is performed to draw the scanning image plane and the surface of the object closer to each other based on the measurement result of the scanning image plane, when the pattern formed on the mask is transferred. Accordingly, the pattern is transferred onto the object via the projection optical system in a state of no defocus. Therefore, it becomes possible to transfer a fine pattern on the object with good accuracy.

According to a third aspect of the present invention, there is provided an exposure apparatus that synchronously moves a mask and an object in a predetermined scanning direction and transfers a pattern formed on the mask onto the object, the apparatus comprising: a mask stage that holds the mask and is movable in at least the scanning direction; an illumination system that illuminates the mask stage with illumination light; a projection optical system that projects the pattern formed on the mask; an aerial image measuring unit that measures a projected image formed by the projection optical system; an object stage that holds the object and moves; a measurement controller that, while moving the mask stage in the scanning direction, at each movement position, illuminates an area on the mask that includes a mark area on which predetermined marks are formed with illumination light from the illumination system, forms an aerial image of at least one mark existing in the mark area via the projection optical system, and measures the aerial image using the aerial image measuring unit; and a computation unit that computes a scanning image plane on which an image of a pattern formed on the mask is formed by the projection optical system, based on the measurement result of the aerial image of the mark at the each movement position.

With this apparatus, the measurement controller moves the mask stage in the scanning direction, illuminates the area including the mark area in which predetermined marks are formed on the mask with illumination light from the illumination system, forms an aerial image of at least one mark existing in the mark area via the projection optical system, and measures the aerial image using the aerial image measuring unit. Such aerial image measurement is repeatedly performed by the measurement controller while moving the mask stage in the scanning direction. Then, the computation unit computes the scanning image plane on which an image of a pattern formed on the mask is formed by the projection optical system based on the measurement result of the aerial image of each mark at each movement position. In other words, since not the pattern surface of the mask but the scanning image plane is measured, the sensor for measuring mask position or the like is not necessary, and also it is not necessary to secure the installing space for the sensor for measuring mask position between the mask and the projection optical system and in the vicinity of the mask stage. Therefore, the degree of freedom in design for the projection optical system increases, and a high-performance projection optical system can be realized, and as a consequence, it becomes possible to realize highly accurate pattern transfer by the high-performance projection optical system.

Further, in a lithography process, a microdevice of higher integration can be manufactured with good yield by transferring a pattern onto an object using the exposure method of the present invention. Therefore, it can also be said from another aspect that the present invention is a device manufacturing method in which the exposure method of the present invention is used.

BEST MODE FOR CARRYING OUT THE INVENTION

Figure 1:
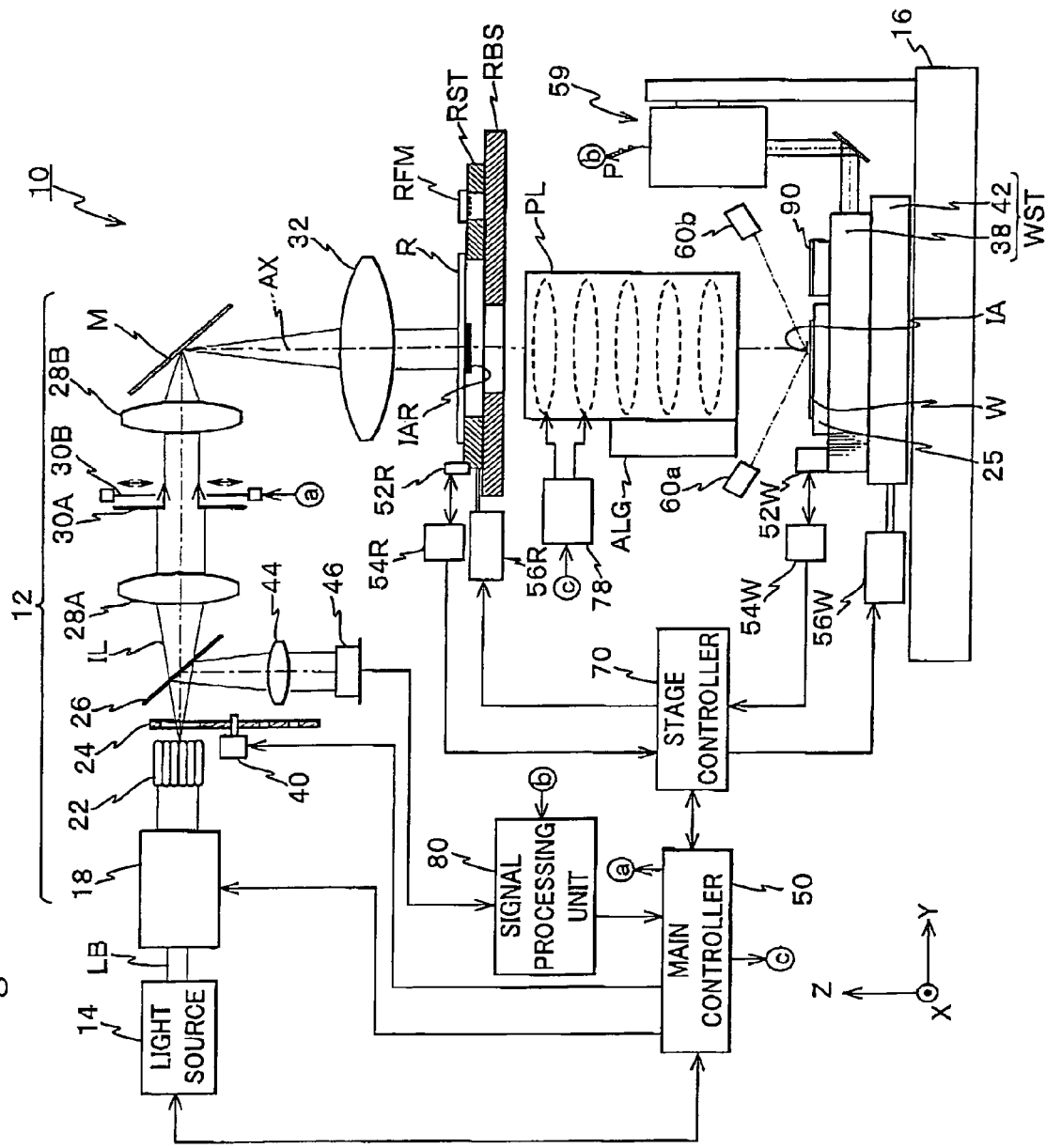
FIG. 1 is a view showing a schematic configuration of an exposure apparatus 10 according to an embodiment of the present invention.

Hereinafter, an embodiment of the present invention will be described based on FIG. 1 to FIG. 11. FIG. 1 shows the schematic configuration of an exposure apparatus 10 according to an embodiment. Exposure apparatus 10 is a scanning projection exposure apparatus by a step-and-scan method, that is, a so-called scanning stepper (also called a scanner).

Exposure apparatus 10 is equipped with: an illumination system including a light source 14 and an illumination optical system 12; a reticle stage RST as a mask stage that holds a reticle R as a mask; a projection optical system PL; a wafer stage WST as an object stage that holds a wafer W as an object and is freely movable within an XY plane; a control system that controls them; and the like. Further, although omitted in the drawings, of each of the above-described constituent portions, portions other than the light source and the control system are actually housed inside an environment-control chamber (environmental chamber) (not shown), where the environmental conditions such as internal temperature and pressure are maintained highly accurately.

As light source 14, in this case, it is assumed that an excimer laser light source making pulse light emission of laser light such as KrF excimer laser light (wavelength: 248 nm) and ArF excimer laser light (wavelength: 193 nm) as an example. Light source 14 is practically installed in a service room or the like having lower cleanness level different from a clean room where the environment-control chamber described above is installed, and is connected to illumination optical system 12 inside the environment-control chamber via a light-transmitting optical system (not shown). The ON/OFF, central wavelength, half spectral band width, repetition frequency or the like of the laser emission of light source 14 is controlled by a main controller 50 that is made up of a workstation (or a microcomputer).

Illumination optical system 12 is equipped with: a beam-shaping optical system 18, a fly-eye lens 22 as an optical integrator, an illumination system aperture stop plate 24, relay optical systems 28A and 28B, a fixed reticle blind 30A, a movable reticle blind 302, a mirror M, a condenser lens 32 and the like. Note that a rod type (internal reflection type) integrator, a diffraction optical element or the like can also be used as the optical integrator.

In beam-shaping optical system 18, for example, a cylinder lens, a beam expander (both are omitted in the drawings) and the like are included, which is used to shape the cross-section shape of a laser beam LB that is a pulsed light emitted by light source 14 so that laser beam LB is efficiently incident on fly-eye lens 22 arranged in the rear of the optical path of laser beam LB.

Fly-eye lens 22 is placed on the optical path of laser beam LB outgoing from beam-shaping optical system 18, and forms a surface light source that is composed of a large number of point light sources (light source images), that is, a secondary light source, in order to illuminate reticle R with uniform illuminance distribution. Laser beam LB emitted from the secondary light source is to be called an "illumination light IL" in this specification.

Illumination system aperture stop plate 24 that is composed of a disc-shaped member is placed in the vicinity of the focal plane on an emission side of fly-eye lens 22. On illumination system aperture stop plate 24, for example, an aperture stop that is composed of a conventional circular opening, an aperture stop for annular (ring-shaped) illumination, an aperture stop for modified light source method and the like are placed substantially equiangularly. Illumination system aperture stop plate 24 is rotated by a drive unit 40 such as a motor controlled by main controller 50, by which any one of the aperture stops is selectively set on the optical path of illumination light IL. In this manner, in the embodiment, various illumination conditions such as annular illumination and modified illumination can be realized.

A beam splitter 26 having small reflectance and large transmittance is placed on the optical path of illumination light IL outgoing from illumination system aperture stop plate 24, and furthermore, the relay optical systems (28A, 28B) are placed in the rear of the optical path by laying reticle blinds 30A and 30B between them.

Fixed reticle blind 30A is placed on a conjugate plane with respect to the pattern surface of reticle R or in the vicinity thereof, and a rectangular opening that defines a slit-shaped illumination area IAR (Refer to FIG. 1) extending on reticle R in an X-axis direction (an orthogonal direction to the page surface of FIG. 1) is formed. Further, movable reticle blind 303 having an opening section which position and width in directions severally corresponding to a scanning direction on scanning exposure (herein, assumed to be a Y-axis direction being a lateral direction on the page surface of FIG. 1) and a non-scanning direction (the X-axis direction), is placed in the vicinity of fixed reticle blind 30A. Movable reticle blind 30B has a pair of L-shaped blades, for example, and the pair of L-shaped blades forms the opening section described above. By further limiting illumination area IAR via movable reticle blind 30B at the starting time and the ending time of scanning exposure, exposure of an unnecessary area is prevented. Further, in the embodiment, movable reticle blind 30B is also used for setting the illumination area when measuring an aerial image (to be described later).

Meanwhile, a condenser lens 44 and an integrator sensor 46, which is composed of a light-receiving element such as a PIN type photodiode having good sensitivity in a deep ultraviolet region and high responding frequency for detecting pulse light emission of light source 14, are placed on the optical path of illumination light IL reflected off beam splitter 26 in illumination optical system 12.

The operation of the illumination system constituted in this manner will be briefly described. After laser beam LB that is a pulsed light emitted from light source 14 is made incident on beam-shaping optical system 18, in which its cross-section shape is shaped so as to be efficiently made incident on fly-eye lens 22 behind it, laser beam LB is made incident on fly-eye lens 22. Thus, the secondary light source is formed on the focal plane on the emission side of fly-eye lens 22 (which substantially matches a pupil plane of illumination optical system 12 in the embodiment). Illumination light IL emitted from the secondary light source reaches beam splitter 26 having large transmittance and small reflectance after passing through any aperture stop on illumination system aperture stop plate 24. Illumination light IL having transmitted beam splitter 26, after passing through the rectangular opening section of fixed reticle blind 30A and the opening of movable reticle blind 30B via first relay lens 28A, passes through second relay lens 28B and its optical path is deflected perpendicularly downward by mirror M. Then, the light passes through condenser lens 32, and illuminates slit-shaped illumination area IAR on reticle R held on reticle stage RST with uniform illuminance distribution.

On the other hand, illumination light IL reflected off beam splitter 26 is received by integrator sensor 46 via condenser lens 44, and a photoelectric conversion signal of integrator sensor 46 is supplied to main controller 50 via a hold circuit (not shown), for example, a peak hold circuit and a signal processing unit 80 having an A/D converter.

A platen section (not shown) is arranged on reticle stage RST, and reticle R is fixed on the platen section, for example, by vacuum suction (or electrostatic suction). In this case, reticle stage RST is finely drivable two-dimensionally within the XY plane perpendicular to an optical axis AX of projection optical system PL (the X-axis direction, the Y-axis direction orthogonal to the X-axis direction, and a rotation direction around a Z-axis (a $\theta z$ direction) orthogonal to the XY plane) by a reticle stage drive system 56R including a linear motor or the like, and also drivable on a reticle base RBS at designated scanning speed in the Y-axis direction. Incidentally, when fixing reticle R on the platen section, a mechanical clamping mechanism that presses reticle R against reticle stage RST can be used in combination in order to prevent positional shift of reticle R caused by acceleration applied when scanning reticle stage RST.

On a +Y side of reticle R of reticle stage RST, a reticle fiducial mark plate (hereinafter, shortly referred to as a "reticle mark plate") RFM serving as a datum member that is made of a glass substrate having good flatness level on the lower surface (hereinafter, referred to as a "datum surface") is arranged extending in the X-axis direction. Reticle mark plate RFM is made of a glass material that is the same material as reticle R such as synthetic quartz, fluorite, lithium fluoride, other fluoride crystal or the like, and is fixed on reticle stage RST. The datum surface of reticle mark plate RFM is set to the same height as the pattern surface of reticle R in design, and has substantially the same size as slit-shaped illumination area IAR. On the datum surface, image-forming characteristics evaluation marks (hereinafter, simply described as "evaluation marks") for measuring image-forming characteristics such as curvature of image plane of projection optical system PL are formed.

Figure 2:
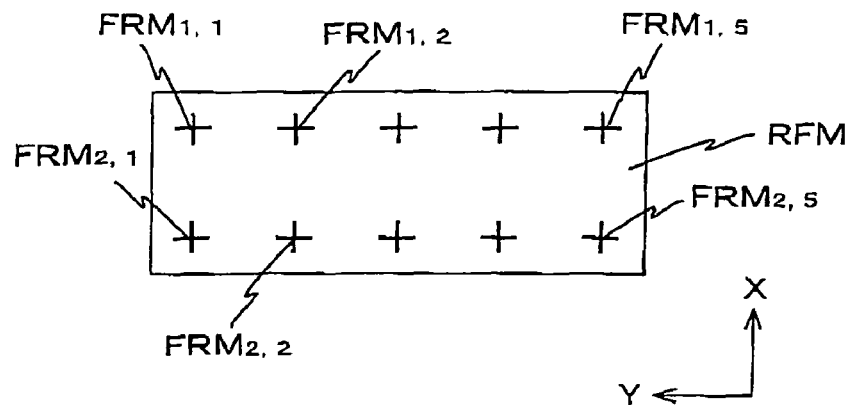
FIG. 2 is a plan view showing a reticle mark plate of FIG. 1.

FIG. 2 shows a plan view showing reticle mark plate RFM. In FIG. 2, two rows of evaluation marks $FRM_{1,1}, \ldots, FRM_{1,5}$ and $FRM_{2,1}, \ldots, FRM_{2,5}$ are formed on the datum surface (the lower surface, the surface in the depth of the page surface of FIG. 2) of reticle mark plate RFM in the X-axis direction at predetermined spacing, for example. As each of evaluation marks $FRM_{1,1}, \ldots, FRM_{1,5}$ and $FRM_{2,1}, \ldots, FRM_{2,5}$, cross marks are used here. However, the evaluation marks are not limited to the cross marks, and may be formed, for example, by two line-and-space patterns whose arrangement directions are orthogonal to each other. Also, their arrangement only has to be distributed on the entire datum surface substantially evenly.

In the embodiment, the configuration is employed in which the image-forming characteristics of projection optical system PL can be efficiently evaluated without changing reticle R for actual exposure to a test reticle, by using reticle mark plate RFM. In the embodiment, further, a projected image plane by projection optical system PL of the datum surface of reticle mark plate RPM is used as a datum of a scanning image plane (to be described later) on the pattern surface of reticle R.

Referring back to FIG. 1, at reticle stage RST, openings that serve as paths of illumination light IL are severally formed below reticle R and reticle mark plate RFM. Further, a rectangular opening larger than illumination area IAR that serves as a path of the illumination light IL is formed in a portion of reticle base RBS substantially directly above projection optical system PL.

A movable mirror 52R that reflects the laser beam from a reticle laser interferometer (hereinafter, referred to as a "reticle interferometer") 54R is fixed on reticle stage RST, and the position of reticle stage RST within the XY plane is constantly detected by reticle interferometer 54R at the resolving power of, for example, about 0.5 to 1 nm. Herein, in actual, a movable mirror having a reflection surface orthogonal to a scanning direction (the Y-axis direction) on scanning exposure and a movable mirror having a reflection surface orthogonal to a non-scanning direction (the X-axis direction) are arranged on reticle stage RST, and a reticle Y interferometer and a reticle X interferometer are arranged corresponding to these movable mirrors. However, they are representatively shown as movable mirror 52R and reticle interferometer 54R in FIG. 1. Meanwhile, for example, the reflection surface (equivalent to the reflection surface of movable mirror 52R) may be formed by performing mirror finish to the end surface of reticle stage RST. Further, instead of a reflection surface extending in the X-axis direction, which is used for positional detection of reticle stage RST in the scanning direction (the Y-axis direction in the embodiment), at least one corner cube mirror (such as a retroreflector) may be used. Herein, one of the reticle X interferometer and the reticle Y interferometer, for example, the reticle Y interferometer is a dual-axis interferometer having two measuring axes, and can measure a rotation around the Z-axis (the $\theta z$ rotation) in addition to the Y-position of reticle stage RST based on the measurement value of reticle Y interferometer.

Positional information of reticle stage RST from reticle interferometer 54R is sent to a stage controller 70 and to main controller 50 via stage controller 70. Stage controller 70 controls movement of reticle stage RST via reticle stage drive system 56R in response to instructions of main controller 50.

Projection optical system PL is placed below reticle stage RST in FIG. 1, and the direction of its optical axis AX is the Z-axis direction. In this case, as projection optical system PL, a both-side telecentric reduction system, which is a dioptric system including a plurality of lens elements placed along an optical axis AX direction at predetermined spacing, is used. The projection magnification of projection optical system PL is, for example, ¼, ⅕ or the like. Therefore, when illumination light IL from illumination optical system 12 illuminates slit-shaped illumination area IAR on reticle R, illumination light IL having passed through reticle R forms a reduced image (partially reduced image) of a circuit pattern of reticle R in slit-shaped illumination area IAR on an exposure area IA, which is conjugate with illumination area IAR, on wafer W which surface is coated with resist (photosensitive agent), via projection optical system PL.

Of the plurality of lens elements of the projection optical system PL, a part of the plurality of lens elements (hereinafter, referred to as "movable lenses") is constituted to be finely drivable in the optical axis AX direction and a tilted direction with respect to the XY plane by a drive element (not shown) (such as piezoelectric element). Drive voltage of each drive element (a drive amount of the drive element) is controlled by an image-forming characteristics correction controller 78 in response to a command from main controller 50, and with this operation, the image-forming characteristics of projection optical system PL such as curvature of image plane, distortion, magnification, spherical aberration, astigmatism and coma are corrected.

Wafer stage WST is configured including an XY stage 42 and a Z-tilt stage 38 mounted on XY stage 42.

XY stage 42 is supported by levitation above the upper surface of a wafer base 16 by an air bearing (not shown), for example, with the clearance of around a few μm, and is constituted to be drivable two-dimensionally in the Y-axis direction being a scanning direction and the X-axis direction orthogonal to the Y-axis direction by a linear motor (not shown) or the like that constitutes a wafer stage drive system 56W. Z-tilt stage 38 is mounted on XY stage 42 and a wafer holder 25 is mounted on Z-tilt stage 38. Wafer holder 25 holds wafer W by vacuum suction (or electrostatic suction) or the like.

Figure 3:
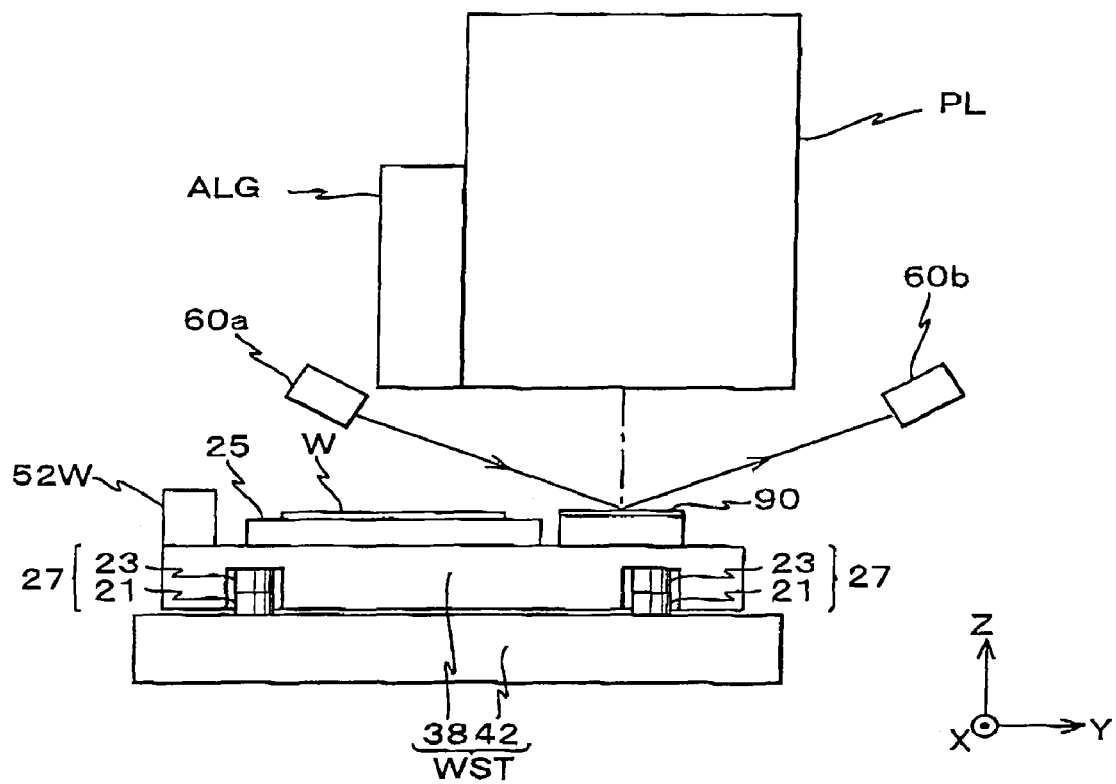
FIG. 3 is a view enlargedly showing the vicinity of a wafer stage in FIG. 1 together with a drive unit of a Z-tilt stage.

As is shown in FIG. 3, Z-tilt stage 38 is supported by three Z-position drive systems 27 (note that Z-position drive system 27 in the depth of the page surface is not shown) at three points on XY stage 42. Each Z-position drive system 27 is configured including three actuators (such as voice coil motors) 21 that individually drives each support point of the bottom surface of Z-tilt stage 38 in the optical axis direction (the Z-axis direction) of projection optical system PL, and encoders 23 that detect a drive amount (displacement from a datum position) of each support point in the Z-axis direction by actuator 21 of Z-position drive system 27 of Z-tilt stage 38. Herein, as each encoder 23, for example, a linear encoder of an optical method, an electrostatic capacity type or the like is used. In the embodiment, three actuators 21 severally constituting three Z-position drive systems 27 constitute a drive unit that drives Z-tilt stage 38 in the optical axis AX direction (the Z-axis direction) and the tilted direction with respect to the plane (the XY plane) orthogonal to the optical axis, that is, a θx direction being a rotation direction around the X-axis and a θy direction being a rotation direction around the Y-axis. Further, a drive amount (a displacement amount from a datum point) of each support point in the Z-axis direction by each Z-position drive system 27 of Z-tilt stage 38, which is measured by each encoder 23, is supplied to stage controller 70 and main controller 50 via stage controller 70, and main controller 50 computes the position in the Z-axis direction and a leveling amount (a θx rotation amount, a θy rotation amount) of Z-tilt stage 38. Incidentally, in FIG. 1, wafer stage drive system 56W is shown including the linear motor or the like that drives XY stage 42 and three Z-position drive systems 27.

A movable mirror 52W that reflects the laser beam from a wafer laser interferometer (hereinafter, referred to as a "wafer interferometer") 54W is fixed on Z-tilt stage 38, and the position of Z-tilt stage 38 (wafer stage WST) within the XY plane is constantly detected with the resolving power of, for example, about 0.5 to 1 nm by wafer interferometer 54 placed outside Herein, in actual, a movable mirror having a reflection surface orthogonal to the Y-axis direction being a scanning direction on scanning exposure and a movable mirror having a reflection surface orthogonal to the X-axis direction being a non-scanning direction are arranged on Z-tilt stage 38, and an X laser interferometer and a Y laser interferometer as the wafer interferometers are arranged corresponding to these movable mirrors. However, in FIG. 1, they are representatively shown by movable mirror 52W and wafer interferometer 54W. Incidentally, for example, a reflection surface (equivalent to the reflection surface of movable mirror 52W) may be formed by performing mirror finish to the end surface of Z-tilt stage 38. Further, the X laser interferometer and the Y laser interferometer are multiaxial interferometers having a plurality of measuring axes, and can measure a rotation (a yawing (a θz rotation being rotation around the Z-axis), a pitching (a θx rotation around rotation around the X-axis), and a rolling (a θy rotation being rotation around the Y-axis)) in addition to the X and Y-positions of Z-tilt stage 38. Therefore, in the description below, it is assumed that wafer interferometer 54W measures the positions of Z-tilt stage 38 in the directions of five degrees of freedom, i.e. X, Y, θz, θy, and θx. Further, the multiaxial interferometer irradiates a laser beam to a reflection surface installed on a frame (not shown), on which projection optical system PL is mounted, via a reflection surface tilted at 45° degrees arranged on the Z-tilt stage 38, and may detect relative positional information regarding the optical axis direction (the Z-axis direction) of projection optical system PL.

Positional information (or velocity information) of Z-tilt stage 38 (wafer stage WST) is supplied to stage controller 70 and main controller 50 via stage controller 70. Stage controller 70 controls the position of Z-tilt stage 38 (wafer stage WST) within the XY plane via wafer stage drive system 56W in response to instructions of main controller 50.

Further, a part of an optical system, which constitutes a part of an aerial image measuring unit 59 (refer to FIG. 1) that is used for measuring the optical characteristics of projection optical system PL, is placed inside Z-tilt stage 38. As is shown in FIG. 4, aerial image measuring unit 59 is equipped with an inside-stage constituent section arranged in Z-tilt stage 38, that is, a slit plate 90, a relay optical system that is composed of lenses 84 and 86, a mirror 88 for deflecting the optical path and a light-transmitting lens 87, and an outside-stage constituent section arranged outside wafer stage WST, that is, a mirror 96, a light-receiving lens 89, an optical sensor 124 and the like.

Figure 4:
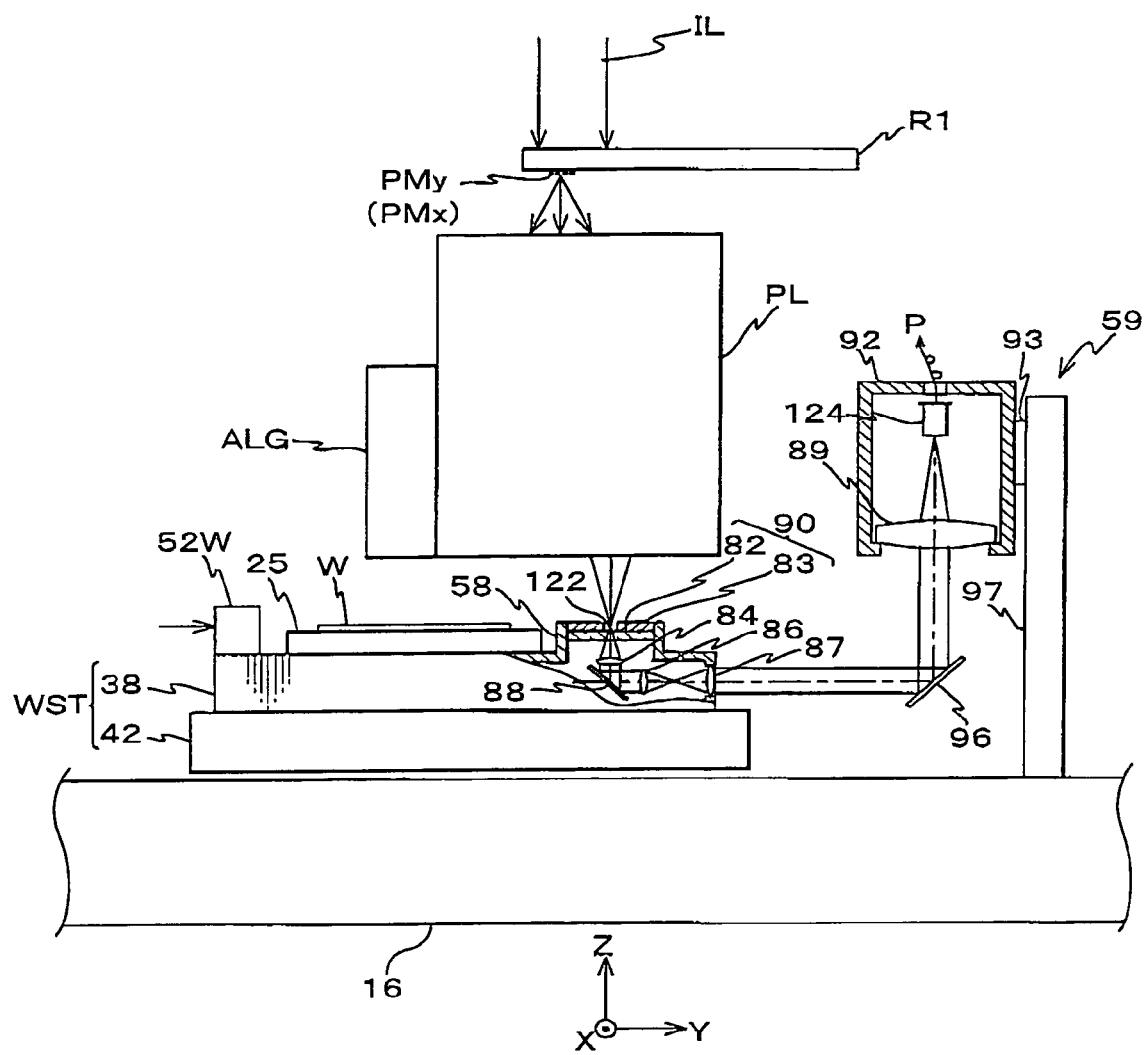
FIG. 4 is a view showing an internal configuration of an aerial image measuring unit in FIG. 1.
Figure 5A:
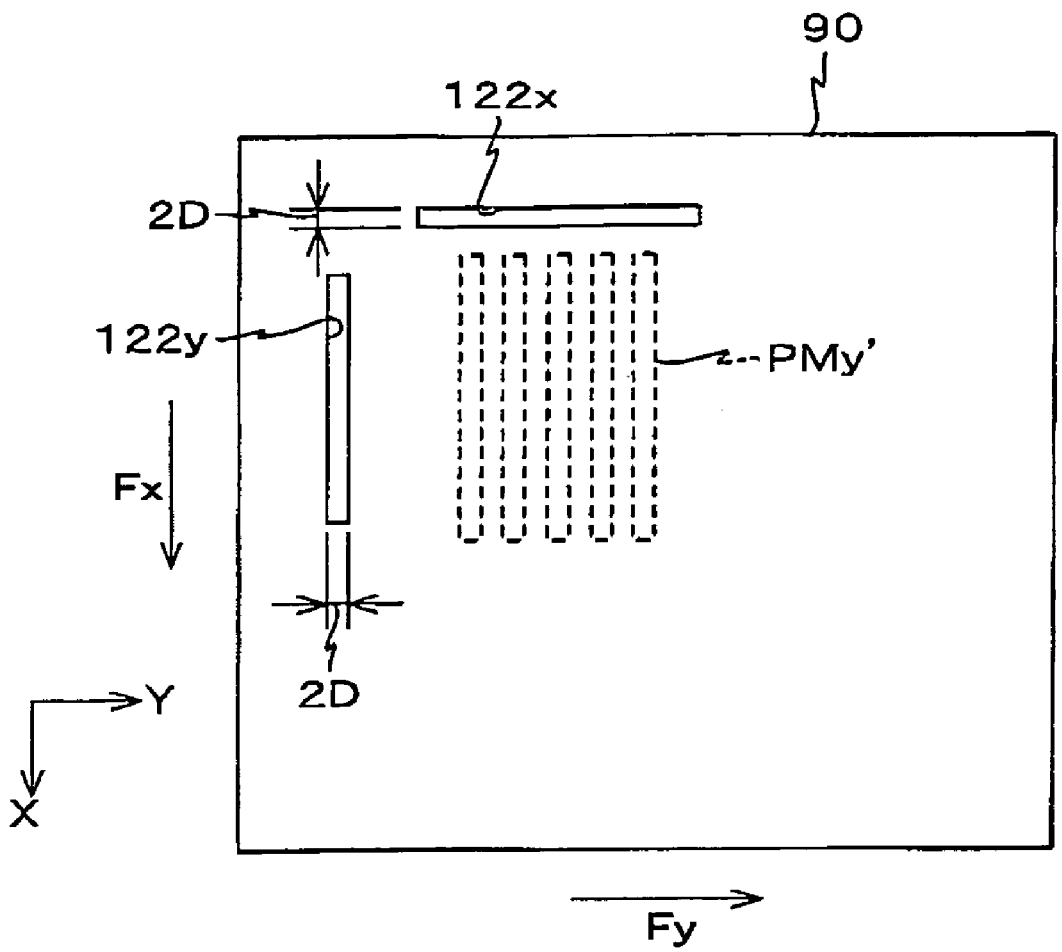
FIG. 5A is a view showing a state where an aerial image PMy' is formed on a slit plate when measuring the aerial image.

More specifically, as is shown in FIG. 4, slit plate 90 is fitted into an opening, which is formed on the top portion of a protruded section 58 arranged on the upper surface of one end portion of wafer stage WST, from above so as to plug the opening. On slit plate 90, a reflective film 83 that also serves as a light-shielding film is formed on the upper surface of light-receiving glass 82 that is rectangular in a plan view (viewed from above), and a slit-shaped aperture pattern (hereinafter, referred to as a "slit") 122 is formed by patterning on a part of reflective film 83. Note that, as is shown in FIG. 5A, a slit 122y extending in the X-axis direction with a predetermined width 2D (e.g. 2D is 0.15 μm (150 nm)) and a slit 122x extending in the Y-axis direction with a predetermined width 2D are actually formed on slit plate 90 in the positional relation as shown in FIG. 4A. However, in FIG. 3, slits 122x and 122y are representatively shown as slit 122. The lengths of slits 122*x* and 122*y* are, for example, about 16 μm to 25 μm. Hereinafter, slits 122*x* and 122*y* are generally referred to as slit 122 appropriately. Herein, slit plate 90 may also serve as at least one of a fiducial mark plate on which fiducial marks used for baseline measurement of an alignment system (to be described later) and other fiducial marks are formed, and a datum reflective plate for performing calibration between sensors of a multipoint focal position detection system (to be described later). It goes without saying that the fiducial mark plate may be arranged separately from slit plate 90.

As a material of light-receiving glass 82, a material such as synthetic quartz or fluorite having good transmissivity to KrF excimer laser light or ArF excimer laser light is used here.

Inside Z-tilt stage 38 below slit 122, the relay optical system (84, 86) made up of lenses 84 and 86 is placed with a mirror 88, which horizontally deflects the optical path of illumination light IL that has been made incident vertically downward via slit 122, laid between the lenses. Light-transmitting lens 87 that transmits an illumination beam, which has been relayed by a predetermined optical path length by the relay optical system (84, 86), to outside wafer stage WST is fixed on the sidewall on a +Y side of wafer stage WST in the rear of the optical path of the relay optical system (84, 86).

On the optical path of illumination light IL that is sent outside wafer stage WST by light-transmitting lens 87, mirror 96 having a predetermined length in the X-axis direction is arranged tilted at an inclination angle of 45 degrees. Mirror 96 deflects the optical path of illumination light IL sent outside wafer stage WST vertically upward by 90 degrees. Light-receiving lens 89 having a larger diameter than that of light-transmitting lens 87 is placed on the deflected optical path. Optical sensor 124 is placed above light-receiving lens 89. Light-receiving lens 89 and optical sensor 124 are housed inside a case 92 in a predetermined positional relation, and case 92 is fixed via an attaching member 93 to the vicinity of the upper end portion of a support column 97 that is implanted on the upper surface of base 16.

As optical sensor 124, a photoelectric conversion element (a light-receiving element) that can detect faint light with good accuracy such as a photo-multiplier tube (PMT) is used. A photoelectric conversion signal P from optical sensor 124 is sent to main controller 50 via signal processing unit 80 in FIG. 1. Note that signal processing unit 80 can be configured including, for example, an amplifier, a sample holder, an A/D converter (one having 16-bit resolving power is generally used) or the like.

Meanwhile, slit 122 is formed on reflective film 83 as described above, but the description will be made below on the assumption that slit 122 is formed on slit plate 90 for convenience.

According to aerial image measuring unit 59 having the configuration as described above, on measurement of a projected image (an aerial image) of each type of marks (to be described later) formed on reticle R or reticle mark plate RFM via projection optical system PL, when illumination light IL having transmitted projection optical system PL illuminates slit plate 90 of aerial image measuring unit 59, illumination light IL having transmitted slit 122 on slit plate 90 is led outside wafer stage WST via lens 84, mirror 88, lens 86 and light-transmitting lens 87. Then, the optical path of illumination light IL led outside wafer stage WST is deflected by mirror 96 vertically upward, the deflected light is received by optical sensor 124 via light-receiving lens 89, and photoelectric conversion signal (light intensity signal) P corresponding to the received light quantity is output from optical sensor 124 to main controller 50 via signal processing unit 80.

In the case of the embodiment, measurement of the projected image (the aerial image) of the evaluation marks or measurement marks is performed by a slit scan method, so that light-transmitting lens 87 moves with respect to light-receiving lens 89 and optical sensor 124 on the measurement. Thus, in aerial image measuring unit 59, the sizes of each lens and mirror 96 are set so that all the light via light-transmitting lens 87 that moves within a predetermined range is made incident on light-receiving lens 89.

As is described above, in aerial image measuring unit 59, slit plate 90, lenses 84 and 86, mirror 88, and light-transmitting lens 87 constitute a light lead-out section that leads illumination light IL having passed through slit 122 outside wafer stage WST, and light-receiving lens 89 and optical sensor 124 constitute a light-receiving section that receives the light led outside wafer stage WST. In this case, these light lead-out section and light-receiving section are mechanically separated from each other. Then, the light lead-out section and the light-receiving section are optically connected to each other via mirror 96 only when measuring the aerial image.

In other words, in aerial image measuring unit 59, since optical sensor 124 is arranged at a predetermined position outside wafer stage WST, the adverse effect due to heat emission from optical sensor 124 on measurement accuracy of wafer interferometer 54W is controlled as much as possible. Further, since the outside and the inside of wafer stage WST are not connected by a light guide or the like, driving accuracy of wafer stage WST does not suffer from adverse effect as in the case the outside and the inside of wafer stage WST are connected by the light guide.

As a matter of course, in the case the influence of heat or the like is negligible or can be eliminated, optical sensor 124 may be arranged inside wafer stage WST. Note that an aerial image measurement method or the like performed by using aerial image measuring unit 59 will be described later in detail.

Referring back to FIG. 1, an off-axis alignment system ALG that detects alignment marks (positioning marks) on wafer W is arranged on the side surface of projection optical system PL. In the embodiment, an alignment sensor by an image processing method, which is a so-called FIA (Field Image Alignment) system is used as alignment system ALG. A detection signal of alignment system ALG is supplied to main controller 50.

Furthermore, as is shown in FIG. 1, exposure apparatus 10 of the embodiment has a light source whose ON/OFF is controlled by main controller 50, and is equipped with a multipoint focal position detection system by an oblique incident method serving as an object position measurement mechanism, which is made up of an irradiation system 60*a* that irradiates image-forming beams for forming images of a large number of pinholes or slits toward the image-forming plane of projection optical system PL from an oblique direction with respect to optical axis AX, and a photodetection system 60*b* that receives the reflected beam of the image-forming beams on the surface of wafer W. Note that the detail configuration of a multipoint focal position detection system similar to the multipoint focal position detection system (60*a*, 60*b*) of the embodiment is disclosed in, for example, Kokai (Japanese Unexamined Patent Application Publication) No. 6-283403 and the corresponding U.S. Pat. No. 5,448,332, and the like. As long as the national laws in designated states (or elected states), to which this international application is applied, permit, the above disclosures of the publication and the U.S. Patent are incorporated herein by reference.

In main controller 50 on scanning exposure or the like, in order to make defocus be zero based on a defocus signal from photodetection system 60*b*, for example, based on an S-curve signal, by controlling the movement in the Z-axis direction and the two-dimensional tilt (i.e. the rotation in the θx and θy directions) of Z-tilt stage 38 via wafer stage drive system 56W, that is, by controlling Z-tilt stage 38 based on the output from the multipoint focal position detection system (60*a*, 60*b*) via stage controller 70 and wafer stage drive system 56W, focus leveling control is executed that substantially matches the image-forming plane of projection optical system PL and the surface of wafer W in exposure area IA (an irradiation area of illumination light IL) that is conjugate with illumination area IAR.

Moreover, although omitted in FIG. 1, in exposure apparatus 10 of the embodiment, a pair of reticle alignment detection systems, which is made up of a TTR (Through The Reticle) alignment system for simultaneously observing reticle marks on reticle R and their corresponding fiducial marks on the fiducial mark plate via projection optical system PL and uses light having an exposure wavelength, is arranged above reticle R at a predetermined distance in the X-axis direction. As these reticle alignment detection systems, a reticle alignment detection system having a configuration similar to the one disclosed in, for example, Kokai (Japanese Unexamined Patent Application Publication) No. 7-176468 and the corresponding U.S. Pat. No. 5,646,413 and the like is used. As long as the national laws in designated states (or elected states), to which this international application is applied, permit, the above disclosures of the publication and the U.S. Patent are incorporated herein by reference.

Moreover, although omitted in the drawings, on the Z-tilt stage 38, a wavefront aberration measuring instrument by the Shack-Hartman method can be installed, which is disclosed in, for example, the pamphlet of International Publication No. 2003/065428 and the like.

Next, aerial image measurement by slit scanning in a horizontal direction (hereinafter, appropriately referred to as "horizontal scanning") using aerial image measuring unit 59 will be briefly described.

FIG. 4 shows the state where aerial images of measurement marks PMy formed on a reticle R1 are being measured using aerial image measuring unit 59. Reticle R1 in FIG. 4 is a test reticle exclusively for aerial image measurement or a device reticle used for manufacturing a device, and reticle R1 representatively shows a reticle on which exclusive measurement marks are formed or a member on which marks used in aerial image measurement of reticle mark plate RFM or the like are formed.

Herein, it is assumed that measurement marks PMy using the X-axis direction as a longitudinal direction and measurement marks PMx using the Y-axis direction as a longitudinal direction are formed at predetermined positions on reticle R1. Herein, measurement marks PMy and measurement marks PMx may be marks having periodicity in the X-axis direction and the Y-axis direction respectively, and for example, they may be line-and-space (L/S) marks having a duty ratio of 1:1. Further, measurement marks PMy and measurement marks PMx may be placed in proximity.

For example, when measuring the aerial images of measurement marks PMy, main controller 50 drives movable reticle blind 30B shown in FIG. 1 via a blind drive unit (not shown), and the illumination area of illumination light IL is limited in a predetermined area including a measurement marks PMy portion (refer to FIG. 4). In this state, when main controller 50 starts emission of light source 14 and illumination light IL irradiates measurement marks PMy, light (illumination light IL) diffracted and scattered by measurement marks PMy is refracted by projection optical system PL, and aerial images (projected images) of measurement marks PMy are formed on the image plane of projection optical system PL. At this point of time, the position of wafer stage WST is assumed to be set so that aerial images PMy' of measurement marks PMy are formed on a +Y side (or a -Y side) of slit 122*y* on slit plate 90, as shown in FIG. 5A.

Then, when stage controller 70 drives wafer stage WST in a +Y direction as indicated by an arrow Fy in FIG. 5A under instructions of main controller 50, slit 122*y* is scanned with respect to aerial images PMy' in the Y-axis direction. During the scanning, the light (illumination light IL) passing through slit 122*y* is received by optical sensor 124 via the photodetection optical system in wafer stage WST, reflective mirror 96 and light-receiving lens 89 outside wafer stage WST, and its photoelectric conversion signal P is supplied to signal processing unit 80 shown in FIG. 1. In signal processing unit 80, predetermined processing is applied to the photoelectric conversion signal to supply a light intensity signal corresponding to aerial images PMy' to main controller 50. Meanwhile, in this occasion, signal processing unit 80 supplies main controller 50 with a signal, which is obtained by normalizing a signal from optical sensor 124 with a signal of integrator sensor 46 shown in FIG. 1 by, for example, division processing, in order to suppress an influence caused by the dispersion of light emission intensity of illumination light IL from light source 14. Main controller 50 obtains an intensity signal (an aerial image profile) of the projected image (the aerial image), by simultaneously loading an output signal from optical sensor 124 input via signal processing unit 80 during the scanning drive, and information on the position in the Y-axis direction (the Y-position) of Z-tilt stage 38 input via stage controller 70 at predetermined sampling intervals.

Figure 5B:
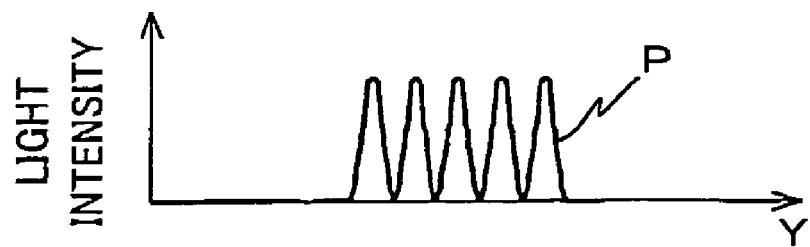
FIG. 5B is a diagram showing an example of a photoelectric conversion signal (a light intensity signal) obtained when performing the aerial image measurement described above.

FIG. 5B shows an example of an intensity signal P of the projected image (the aerial image) obtained on the above-described aerial image measurement.

In the case of measuring the aerial images of measurement marks PMx, by setting the position of wafer stage WST so that the aerial images of measurement marks PMx are formed on a +X side (or a -X side) of slit 122*x* on slit plate 90 and driving wafer stage WST in a +X direction as indicated by an arrow Fx shown in FIG. 5A to perform measurement similar to the above-described measurement by a slit scanning method, an intensity signal corresponding to the aerial images of measurement marks PMx can be obtained.

Figure 6:
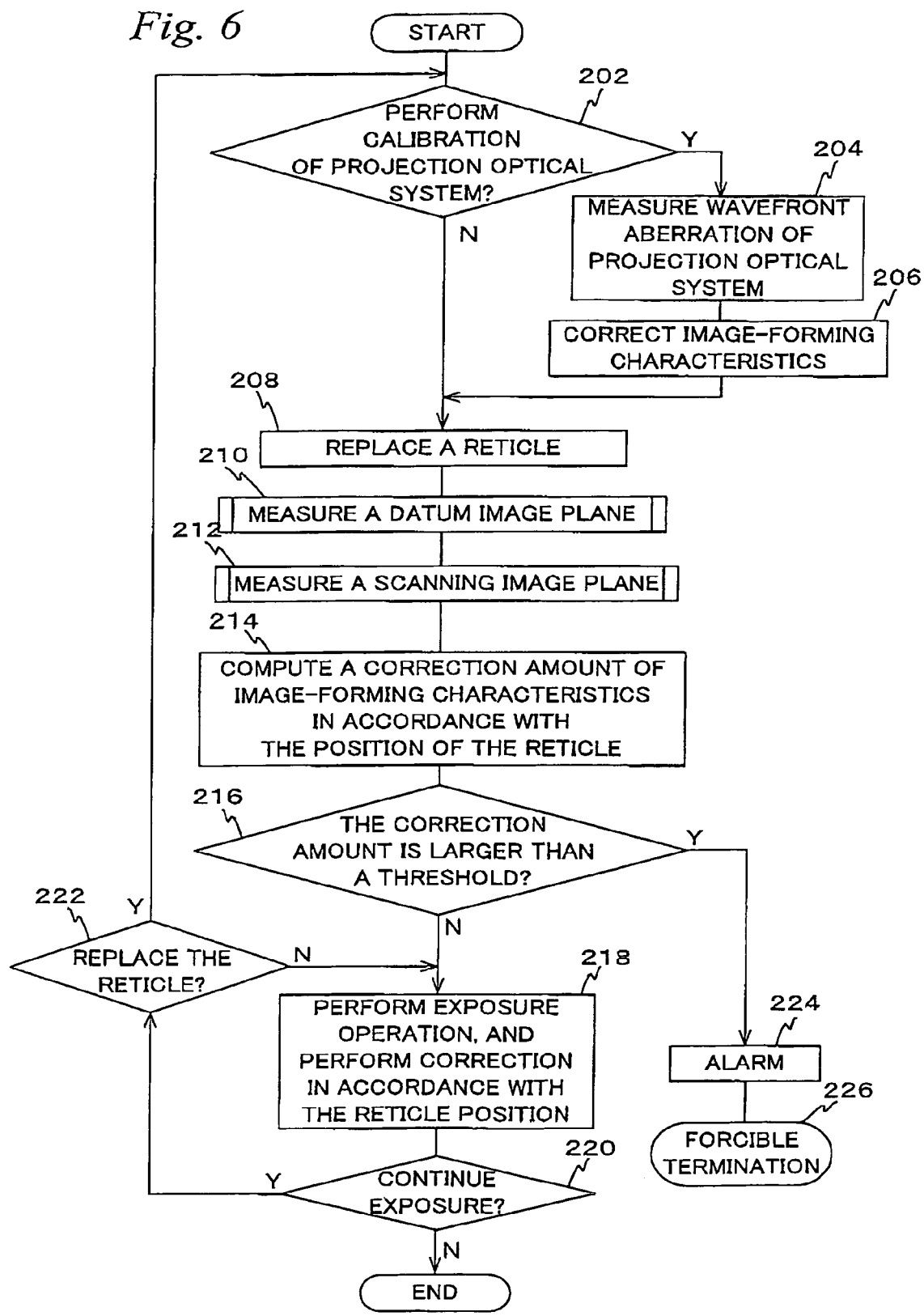
FIG. 6 is a flowchart showing a processing algorithm of a CPU inside a main controller 50 regarding an exposure operation including a measurement operation of a scanning image plane of the pattern surface of a reticle R, in the exposure apparatus of an embodiment.

Next, the description will be made for an example of an exposure operation that includes a measurement operation of a scanning image plane of the pattern surface of reticle R described above in exposure apparatus 10 of the embodiment, based on the flowchart in FIG. 6 showing a processing algorithm of the CPU inside main controller 50.

It is assumed that calibration of output between a plurality of sensors (photodetectors) that detect surface positional information at each detection point of the multipoint focal position detection system (60*a*, 60*b*) is completed and the surface positional information output from each sensor is accurate. Further, it is also assumed that the above-described wavefront aberration measuring instrument by the Shack-Hartman method is installed on Z-tilt stage 38.

First, in step 202 in FIG. 6, based on data stored in a predetermined area in a RAM, whether or not to perform calibration (so-called lens calibration) of the image-forming characteristics of projection optical system PL is judged. Herein, in the case an operator has input a command of executing the lens calibration via an input device (not shown), data on lens calibration execution command is stored in the above-described predetermined area of the RAM, and in the case the above-described command has not been input, the data on lens calibration execution command is not stored. The operator usually instructs the execution of lens calibration when necessary depending on the stability of the image-forming characteristics of projection optical system PL.

Then, in the case the judgment in step 202 is affirmed, the procedure moves to a subroutine of wavefront aberration measurement processing of the projection optical system in step 204. In the subroutine in step 204, by using a pinhole reticle for measuring wavefront aberration and the above-described wavefront aberration measuring instrument, measurement of wavefront aberration of projection optical system PL is performed at a predetermined number of measurement points (evaluation points) in an effective area in the field of projection optical system PL (in this case, the area is to be an area substantially corresponding to illumination area IAR), in a procedure as disclosed in detail in, for example, the pamphlet of International Publication No. 2003/065428 and the like. By the processing in step 204, coefficients of terms in a Fringe Zernike polynomial (e.g. coefficients of the $1^{st}$ term to the $37^{th}$ term), in which the wavefront of each evaluation point is developed, are obtained.

In the next step, step 206, based on the coefficients of terms in a Fringe Zernike polynomial obtained in step 204, a command value of a drive amount in a direction of each degree of freedom of each movable lens described above, with which the wavefront aberration of projection optical system PL becomes the minimum at all evaluation points, is computed and the values are given to image-forming characteristics correction controller 78. Thus, the image-forming characteristics correction controller 78 computes the drive voltage of each drive element corresponding to the command value, and each drive element is driven at the computed drive voltage, so that calibration (lens calibration) of the image-forming characteristics of the projection optical system is performed.

On the other hand, in the case the judgment in step 202 is denied or the above-described lens calibration ends, the procedure moves to step 208, and the reticle is replaced (in the case a reticle is not mounted on reticle stage RST, a reticle is simply loaded). Herein, a reticle that is actually used for exposing a circuit pattern (referred to as a reticle R) is held by suction on a platen (not shown) equipped with a vacuum chuck on reticle stage RST in FIG. 1.

Figure 9:
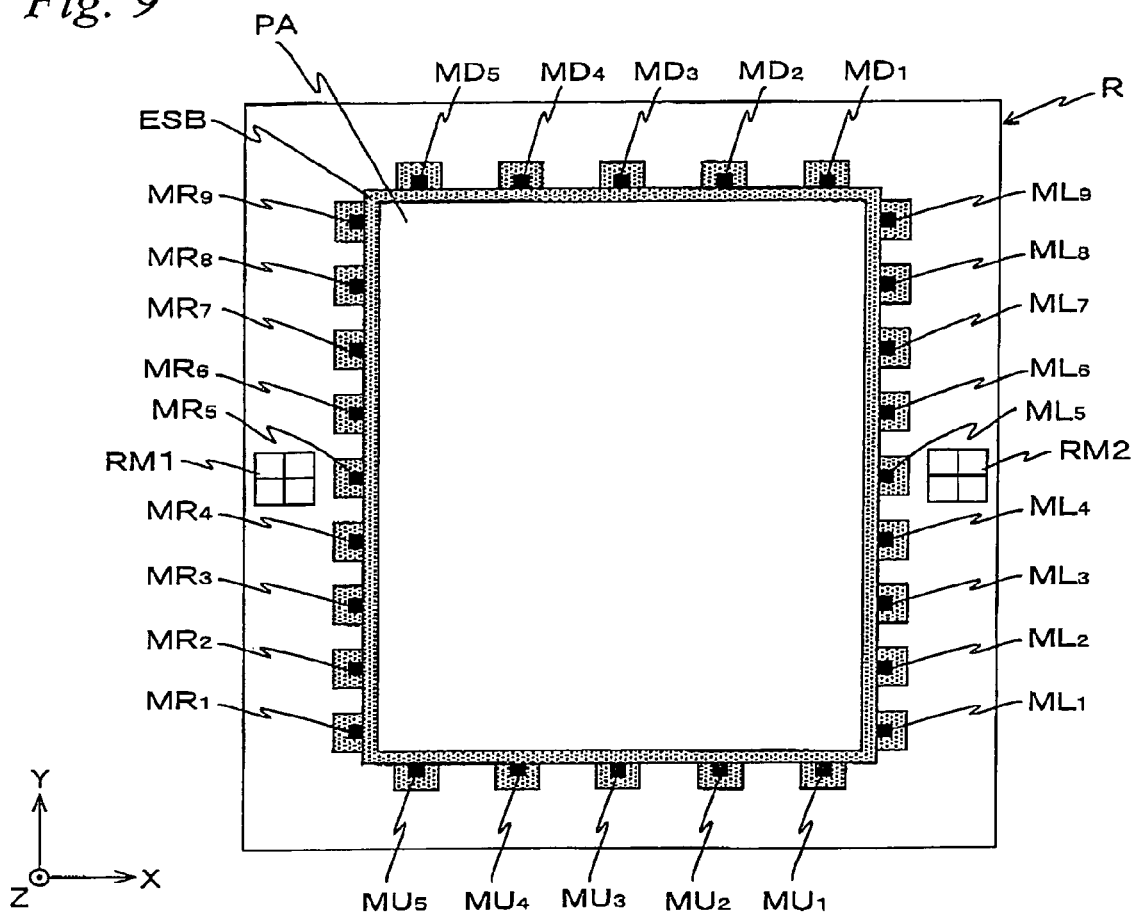
FIG. 9 is a plan view showing reticle R.

Reticle R will be described next. FIG. 9 shows a plan view of reticle R. On reticle R, a rectangular-frame-shaped light-shielding band ESB made of a metal film such as chromium is formed, which partitions a pattern area PA. Then, mark areas $MR_1$ to $MR_9$, $ML_1$ to $ML_9$, $MU_1$ to $MU_5$, and $MD_1$ to $MD_5$ of about 100 to 500 µm square (25 to 125 µm square at converted value on wafer) are formed across the entire periphery of light-shielding band ESB. Light-shielding band ESB has a width of 1 to 6 mm on the reticle, for example, 1.4 mm (350 µm at the converted value on wafer) and the size of pattern area PA partitioned by light-shielding band ESB is about 100 mm×132 mm (25 mm×33 mm at converted value on wafer) at the maximum in the case the external shape of reticle R is about 150 mm square.

Further, a pair of reticle alignment marks RM1 and RM2 are severally formed at positions that are bilaterally symmetrical to a linear reticle center in the non-scanning direction passing the center on reticle R (the reticle center).

As is shown in FIG. 9, along a pair of first facing sides parallel with the scanning direction (the Y-axis direction) of light-shielding band ESB and outside light-shielding band ESB, nine pairs of mark areas $MR_1$ and $ML_1$, $MR_2$ and $ML_2$, ..., and $MR_9$ and $ML_9$ are placed symmetrical to an axis in the scanning direction passing the center of pattern area PA. It is desirable that each mark area is away from pattern area PA at a predetermined distance or more, for example, at about a width of the light-shielding band (e.g. about 1 to 6 mm on the reticle) or more. This is because illumination light IL can be irradiated on pattern area PA without irradiating illumination light IL on the mark areas when performing exposure, by adjusting a width of the opening of movable reticle blind 30B in the non-scanning direction so that the edges of each blade reach a pair of facing sides parallel with the Y-axis direction of the light-shielding band.

Further, along a pair of second facing sides parallel with the non-scanning direction (the X-axis direction) of light-shielding band ESB and outside light-shielding band ESB, five pairs of mark areas $MD_1$ and $MU_1$, $MD_2$ and $MU_2$, ..., and $MD_5$ and $MU_5$ are placed symmetrical to an axis in the non-scanning direction (and an axis in the scanning direction) passing the center of pattern area PA. It is desirable that each mark area is away from pattern area PA at a predetermined distance or more, for example, at about a width of the light-shielding band (e.g. about 1 to 6 mm on the reticle,) or more. In this case, it is desirable to place mark areas $MD_1$ and $MU_1$, $MD_2$ and $MU_2$, ..., $MD_5$ and $MU_5$ in positions at a distance of 2 mm or more from a pellicle frame when a pellicle is attached to reticle R.

Figure 10:
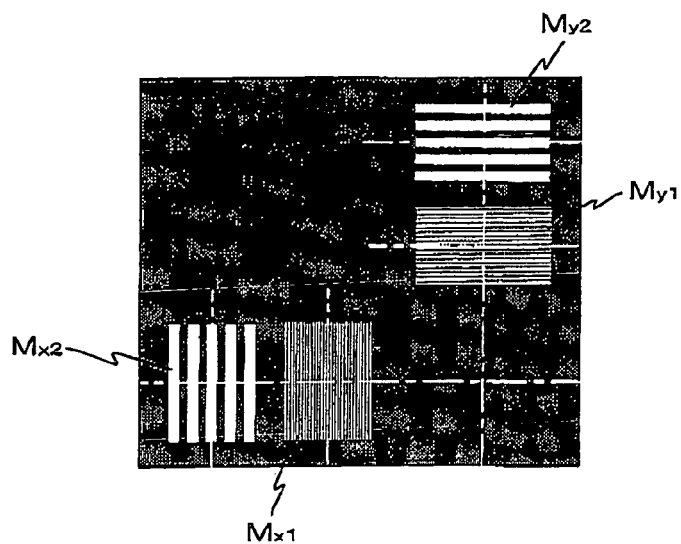
FIG. 10 is a view enlargedly showing a mark area on the reticle in FIG. 9.

As is shown in FIG. 10, a focus measurement mark $Mx_1$ and an image position measurement mark $Mx_2$ which period direction is the X-axis direction, and a focus measurement mark $My_1$ and an image position measurement mark $My_2$ which period direction is the Y-axis direction are respectively formed on each of mark areas $MR_1$ to $MR_9$, $ML_1$ to $ML_9$, $MD_1$ to $MD_5$, and $MU_1$ to $MU_5$.

Further, it is preferable that the periphery of each mark area described above is surrounded by a light-shielding pattern (a light-shielding film) made of chromium or the like having a width of about 1 to 6 mm on the reticle, for example, 1.4 mm (350 µm at the converted value on wafer) to prevent stray light during measurement.

In the embodiment, as each of focus measurement marks $Mx_1$ and $My_1$, a 29-line L/S mark having a line width of 0.8 µm (0.2 µm at converted value on wafer) and a duty ratio of 1:1 is used, and as each of image position measurement marks $Mx_2$ and $My_2$, a 5-line L/S mark having a line width of 4.0 µm (1.0 µm at the converted value on wafer) and a duty ratio of 1:1 is used, as an example. In the embodiment, the image position measurement mark is a L/S mark having a thick line width, however, the focus measurement marks can also serve as the image position measurement marks.

Referring back to the description of FIG. 6, after replacing a reticle in step 208, the procedure moves to a subroutine in step 210, in which measurement processing of a datum image plane is performed.

Herein, it is assumed that measurement order is set in advance so that aerial image measurement of each of ten evaluation marks on reticle mark plate RFM is performed in the order of evaluation marks $FRM_{1,1}$, $FRM_{1,2}$, ..., $FRM_{1,5}$, $FRM_{2,5}$, $FRM_{2,4}$, ..., and $FRM_{2,1}$.

Figure 7:
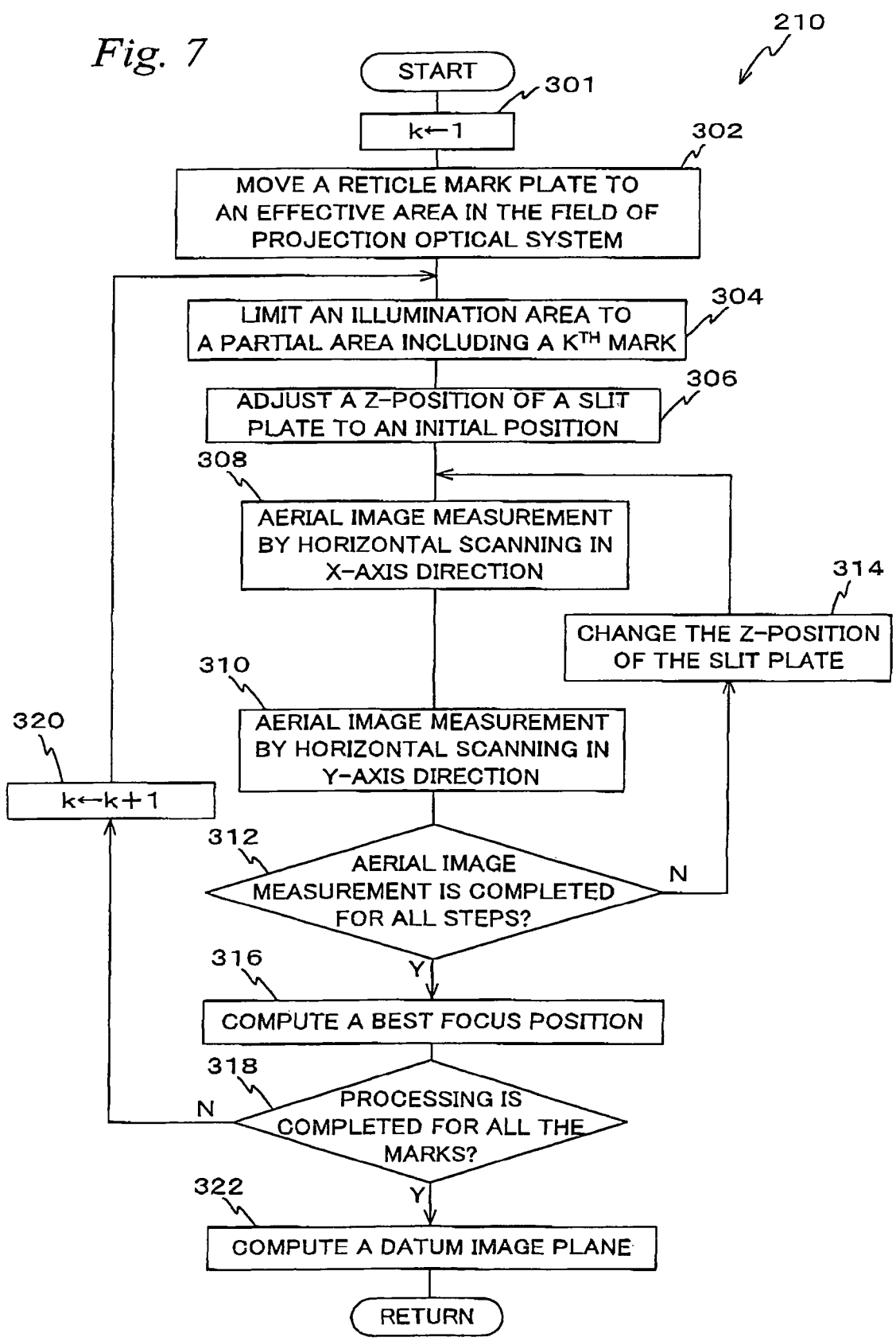
FIG. 7 is a flowchart showing a specific example of a subroutine 210 in FIG. 6.

In subroutine 210, first of all in step 301 in FIG. 7, a count value k of a first counter that indicates the measurement order of the evaluation marks is initialized to 1 (k←1).

In the next step, step 302, reticle stage RST is driven via reticle stage drive system 56R and the position of reticle mark plate RFM is set in the effective field (which is substantially matches illumination area IAR) of projection optical system PL.

In the next step, step 304, movable reticle blind 30B is driven via a blind drive unit (not shown), and the irradiation area of illumination light IL is limited to a partial area including a $k^{th}$ evaluation mark (a first evaluation mark $FRM_{1,1}$ in this case).

In the next step, step 306, in order that a height position of the surface of slit plate 90, that is, a position in the Z-axis direction (hereinafter, simply referred to as a "Z-position") becomes a predetermined initial position, the Z-position of Z-tilt stage 38 is adjusted via stage controller 70. As the "initial position" in this case, for example, a Z-position (a height position) of default setting, for example, a neutral position (an origin position) of encoder 23 is employed at the time of starting the exposure apparatus or in the case a previously detected best focus position is deleted due to the initialization of the apparatus or the like. Then, in the case data on the detection result of the best focus position performed last time (a measurement value of the multipoint focal position detection system) is not deleted but stored in a memory or the like of main controller 50, the best focus position being the data on detection result is to be employed.

In the next step, step 308, aerial image measurement by horizontal scanning in the X-axis direction, which is similar to the previously described measurement of measurement marks PMx, is performed to the $k^{th}$ evaluation mark (first evaluation mark $FRM_{1,1}$ in this case), and an intensity signal (an aerial image profile) where the axis of abscissas of a projected image (an aerial image) of the $k^{th}$ evaluation mark (first evaluation mark $FRM_{1,1}$ in this case) is used as the X-position is obtained.

In the next step, step 310, aerial image measurement by horizontal direction scanning in the Y-axis direction, which is similar to the previously explained measurement of measurement marks PMy, is performed to the $k^{th}$ evaluation mark (first evaluation mark $FRM_{1,1}$ in this case), and an intensity signal (an aerial image profile) where the axis of abscissas of a projected image (an aerial image) of the $k^{th}$ evaluation mark (first evaluation mark $FRM_{1,1}$ in this case) is used as the Y-position is obtained.

In the next step, step 312, the judgment is made of whether or not the Z-position of slit plate 90 has been changed for a predetermined number of steps (to be 15 steps in this case) and aerial image measurement has been performed. Herein, since aerial image measurement has been only performed to the initial position of slit plate 90, the judgment in step 312 is denied, and the procedure moves to step 314, in which the Z-position of slit plate 90 is changed according to a predetermined procedure, and then the procedure returns to step 308.

Herein, the setting and the changes of the Z-position of slit plate 90 in step 314 described above are performed by the multipoint focal position detection system (60a, 60b) based on the output at a detection point near a $k^{th}$ image (an image of first evaluation mark $FRM_{1,1}$ in this case). The order of the settings and the changes of the Z-position of slit plate 90 may be arbitrary.

Meanwhile, in an exposure apparatus using a high-NA projection optical system, when performing measurement that uses evaluation marks (or measurement marks) having a narrow line width, for example, a line width of 0.2 μm or less at converted value on wafer, the Z-position of slit plate 90 (slits 122x, 122y) could be outside the range of a depth of focus (passing the best focus position), for example, on the first change due to the narrow depth of focus, in the case the value of Δz (step-pitch) is too large. Therefore, it is desirable to set the value to a relatively small value, for example, about 0.01 μm to 0.05 μm.

After that, the loop processing of steps 308→310→312→314→308 is repeated until the judgment in step 312 is affirmed.

In this manner, the procedure moves to step 316 when judgment in step 312 is affirmed. At this point of time, regarding the $k^{th}$ evaluation mark (first evaluation mark $FRM_{1,1}$ in this case), the intensity signal (the aerial image profile) of an aerial image by X-axis direction horizontal scanning and the intensity signal (the aerial image profile) of an aerial image by Y-axis direction scanning are obtained with respect to each of Z-positions of 15 steps.

In step 316, based on the intensity signal of total 30 aerial images regarding the $k^{th}$ evaluation mark (first evaluation mark $FRM_{1,1}$ in this case), the best focus position of the $k^{th}$ evaluation mark (first evaluation mark $FRM_{1,1}$ in this case) is computed as described in a to c. below.

a. 15 contrast values of intensity signal by horizontal scanning in the X-axis direction, which have been obtained with respect to each Z-position (each optical axis direction position) of slit plate 90, are computed, function fitting is applied to the contrast values by the least-squares method to obtain a contrast curve (a relationship between contrast and focus position), and a best focus position $Z_{kx}$ (a focus position having the maximum contrast) in the case when the $k^{th}$ evaluation mark (first evaluation mark $FRM_{1,1}$ in this case) is treated as an X mark is computed based on the peak point of the contrast curve.

b. Similarly, 15 contrast values of intensity signal by horizontal scanning in the Y-axis direction, which have been obtained with respect to each Z-position (each optical axis direction position) of slit plate 90, are computed, function fitting is applied to the contrast values by the least-squares method to obtain a contrast curve, and a best focus position $z_{ky}$ in the case when the $k^{th}$ evaluation mark (first evaluation mark $FRM_{1,1}$ in this case) is treated as a Y mark is computed based on the peak point of the contrast curve.

c. Next, the average value $(Z_{kx}+Z_{ky})/2$ of best focus positions $Z_{kx}$ and $Z_{ky}$ is used as a best focus position (a best image-forming plane position) $Zbest_k$ of a point on the datum surface of reticle mark plate RFM on which the $k^{th}$ evaluation mark (first evaluation mark $FRM_{1,1}$ in this case) is formed. As a matter of course, the $Zbest_k$ is the measurement value (i.e. an offset value from a detection origin that has been set) of the sensor of the multipoint focal position detection system (60a, 60b) that detects a Z-position of the surface of a detection subject at a detection point closest to the image of the $k^{th}$ evaluation mark (first evaluation mark $FRM_{1,1}$ in this case).

Meanwhile, it goes without saying that the measurement positions in the Z-axis direction are not limited to the above-described 15 positions, and the number of measurement positions may be another arbitrary number.

Note that in some exposure processes where the exposure apparatus is used, a pattern which longitudinal direction is parallel with either the X-axis direction or the Y-axis direction becomes particularly important. Therefore, when performing the above-described averaging processing of $Z_{kx}$ and $Z_{ky}$ for computing best focus position $Zbest_k$, the averaging processing can be performed by weighting the best focus position of a pattern in an important direction.

In the next step, step 318, whether or not processing has ended for all evaluation marks is judged. Since only processing for first evaluation mark $FRM_{1,1}$ has ended in this case, the judgment is denied, and the procedure moves to step 320. After count value k of the first counter is incremented by 1 (k←k+1), the procedure returns to step 304, and afterward the foregoing processing of step 304 and the subsequent steps is repeated until the judgment in step 318 is affirmed.

Thus, regarding each of $2^{nd}$ to $10^{th}$ evaluation marks $FRM_{1,2}, FRM_{1,3}, \ldots, FRM_{1,5}, FRM_{2,5}, FRM_{2,4}, \ldots, FRM_{2,1}$, the measurement of an aerial image (obtaining an intensity signal (an aerial image profile) of a projected image (an aerial image)) by horizontal scanning in the X-axis direction and horizontal scanning in the Y-axis direction, and the computation of best focus positions $Zbest_2$ to $Zbest_{10}$ of a point (an evaluation point) on the datum surface of reticle mark plate RFM where each evaluation mark is formed are performed in 15 steps of Z-positions.

Then, when the judgment in step 318 is affirmed, the procedure moves to step 322, in which a datum image plane, that is, a projected image plane by projection optical system PL of the datum surface of reticle mark plate RFM is computed, by computing an approximate curved surface (or an approximate plane) by the least-squares method, and then, the processing of the subroutine ends and the procedure returns to step 212 of the main routine.

In step 212, the processing of a subroutine to measure a scanning image plane on which an image of a pattern of reticle R is formed by projection optical system PL is performed. Herein, the scanning image plane is equivalent to a surface like the tracks of the image plane on which "local areas" within the reticle pattern surface, which sequentially move due to scanning, are projected on a wafer W side via projection optical system PL, and it includes flatness level error (including unevenness caused by deformation) of reticle R, reticle R vertical movement associated with the position changes of reticle stage RST in the scanning direction, and fluctuation of an image plane position caused by pitching and rolling.

Figure 8:
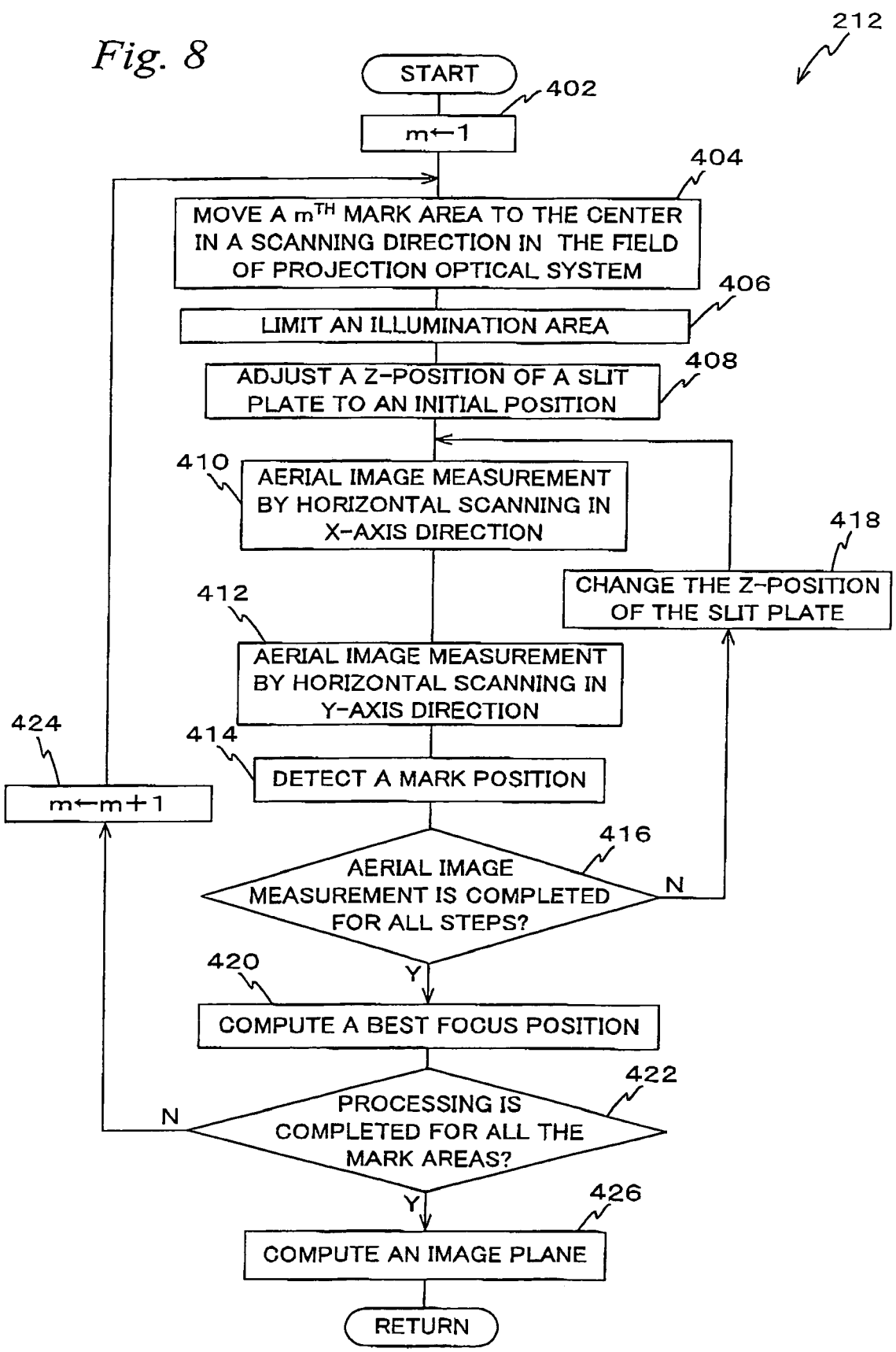
FIG. 8 is a flowchart showing a specific example of a subroutine 212 in FIG. 6.

FIG. 8 shows an example of the subroutine of step 212.

Herein, it is assumed that measurement order is set in advance so that aerial image measurement of a measurement mark of each of 20 mark areas on reticle R is performed in the order of mark areas $MU_3$, $MR_1$, $ML_1$, $ML_2$, $MR_2$, $MR_3$, $ML_3$, . . . , $MR_9$, $ML_9$, and $MD_3$.

In subroutine 212, first, a count value m of a second counter, which indicates the number of a mark area being the subject of aerial image measurement, is initialized to 1 (m←1) in step 402 of FIG. 8.

In the next step, step 404, based on count value m of the second counter described above, reticle stage RST is driven so that a $m^{th}$ mark area (a first mark area $MU_3$ in this case) is positioned at the center in the scanning direction within the field of projection optical system PL. Note that the positional adjustment of reticle stage RST in step 404 can be performed, for example, based on a detection result obtained by simultaneously detecting the pair of reticle alignment marks RM1 and RM2 using the pair of reticle alignment detection systems described previously.

In the next step, step 406, movable reticle blind 30B is driven via a blind drive unit (not shown), and the opening of movable reticle blind 30B is set so that the irradiation area of illumination light IL is limited only to an area near the $m^{th}$ mark area (first mark area $MU_3$ in this case).

In the next step, step 408, a Z-position of Z-tilt stage 38 is adjusted via stage controller 70 so that a Z-position of the slit plate 90 surface becomes a predetermined initial position in the similar manner to the above-described step 306.

In the next step, step 410, by the horizontal scanning in the X-axis direction similar to the above-described step 308, aerial image measurement of focus measurement mark $Mx_1$ and image position measurement mark $Mx_2$ in the $m^{th}$ mark area (first mark area $MU_3$ in this case) is performed, and an intensity signal (an aerial image profile) of the projected image (the aerial image) of focus measurement mark $Mx_1$ and image position measurement mark $Mx_2$ is obtained.

In the next step, step 412, by the horizontal scanning in the Y-axis direction similar to the above-described step 310, aerial image measurement of focus measurement mark $My_1$ and image position measurement mark $My_2$ in the $m^{th}$ mark area (first mark area $MU_3$ in this case) is performed, and an intensity signal (an aerial image profile) of the projected image (the aerial image) of focus measurement mark $My_1$ and image position measurement mark $My_2$ is obtained.

In the next step, step 414, based on the intensity signal (the aerial image profile) of the projected images (the aerial images) of image position measurement marks $Mx_2$ and $My_2$ respectively obtained in steps 410 and 412 described above, a projection position (an X-position) of image position measurement mark $Mx_2$ and a projection position (a Y-position) of image position measurement mark $My_2$ are severally detected. In this case, for example, a coordinate position (an X-position) in a measurement direction of the midpoint of two intersections between the aerial image profile (the aerial image profile is a bell shape) of image position measurement mark $Mx_2$ and a predetermined slice level can be used as the projection position of image position measurement mark $Mx_2$. The same applies to image position measurement mark $My_2$.

In the next step, step 416, the judgment is made of whether or not the Z-position of slit plate 90 has been changed for the number of steps determined in advance (to be 15 steps in this case) and aerial image measurement has been performed. Herein, since aerial image measurement has only been performed to the initial position of slit plate 90, the judgment in step 416 is denied, and the procedure moves to step 418. After the Z-position of the slit plate 90 is changed according to the predetermined procedure similarly to the above-described step 314, the procedure returns to step 410, and the loop processing of steps 410→412→414→416→418→410 is repeated until the judgment in step 416 is affirmed.

Thus, regarding the $m^{th}$ mark area (first mark area $MU_3$ in this case), the intensity signal (the aerial image profile) of the aerial images of focus measurement mark $Mx_1$ and image position measurement mark $Mx_2$ and the intensity signal (the aerial image profile) of the aerial images of focus measurement mark $My_1$ and image position measurement mark $My_2$ are obtained, and the projection position of image position measurement mark $Mx_2$ and the projection position of image position measurement mark $My_2$ are computed, with respect to each Z-position in 15 steps.

On the other hands the procedure moves to step 420 in the case the judgment in step 416 is affirmed, and the best focus positions of focus measurement marks $Mx_1$ and $My_1$ are severally computed in the similar procedure to the above-described step 316, and the average value of the computation result of the two best focus positions is stored in a memory as the best focus position (the best image-forming plane position) of a point on the pattern surface of reticle R where the $m^{th}$ mark area is formed.

Further, in step 420, the projection position of image position measurement marks $Mx_2$ and $My_2$ at the Z-position same as the best focus position of each of focus measurement marks $Mx_1$ and $My_1$ is stored in the memory as the projection positions of image position measurement marks $Mx_2$ and $My_2$ in the $m^{th}$ mark area.

In the next step, step 422, whether or not processing has ended for a planned number of mark areas (20 mark areas in this case) is judged. Since only processing for first mark area $MU_3$ has ended in this case, the judgment in step 422 is denied, the procedure moves to step 424, in which count value m is incremented by 1 (m–m+1), and then the procedure retunes to step 404. Afterward, the foregoing processing of step 404 and the succeeding steps is repeated until the judgment in step 422 is affirmed.

Thus, measurement of the aerial images of the four measurement marks inside each of $2^{nd}$ to the $20^{th}$ mark areas $MR_1$, $ML_1$, $ML_2$, $MR_2$, $MR_3$, $ML_3$, . . . , $MR_9$, $ML_9$, and $MD_3$ is performed to obtain the intensity signal (the aerial image profile) of the projected image (the aerial image), and the best focus position (the best image-forming plane position) of a point on the pattern surface of reticle R where each mark area is formed, the projection position (the X-position) of image position measurement mark $Mx_2$ and the projection position (the Y-position) of image position measurement mark $My_2$ are stored in the memory.

On the other hand, the procedure moves to step 426 when judgment in step 422 is affirmed, and the scanning image plane of the pattern surface of reticle R is computed (estimated) as follows.

Figure 11:
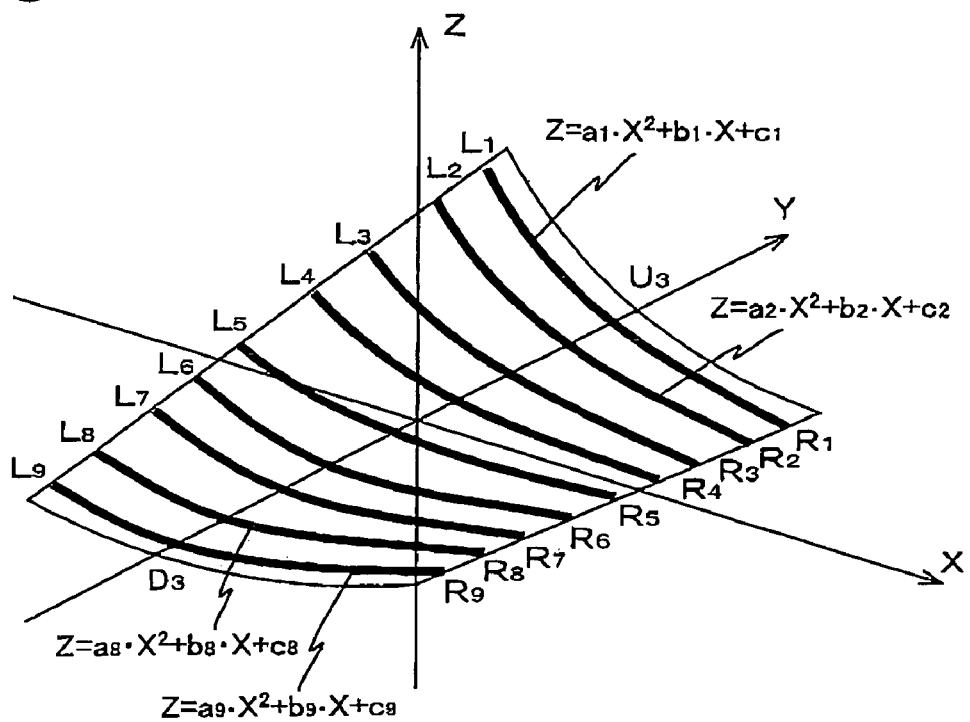
FIG. 11 is a view for explaining a computation method of a scanning image plane according to an embodiment.

At the stage where the judgment in step 422 is affirmed, 20 evaluation points on the scanning image plane where an image of the pattern formed on reticle R mounted on reticle stage RST is formed by projection optical system PL, that is, Z positional information of evaluation points $U_3$, $L_1$ to $L_9$, $R_1$ to $R_9$ and $D_3$ shown in FIG. 11, that is, measurement results $Z(U_3)$, $Z(L_1)$ to $Z(L_9)$, $Z(R_1)$ to $Z(R_9)$ and $Z(D_3)$ of the best focus positions of points on the pattern surface, which correspond to mark areas $MU_3$, $ML_1$ to $ML_9$, $MR_1$ to $MR_9$ and $MD_3$ are stored in the memory.

Therefore, by using measurement results $Z(U_3)$, $Z(L_1)$ to $Z(L_9)$, $Z(R_1)$ to $Z(R_9)$ and $Z(D_3)$, the shape of the entire scanning image plane is expressed by using a function as follows.

In FIG. 11, there are 9 pairs of evaluation points (measurement points) $(L_1, U_3, R_1), (L_2, R_2), \ldots,$ and $(L_9, D_3, R_9)$ in the Y-axis direction. Of the 9 pairs of evaluation points, Y coordinates of the evaluation points making a pair with each other are equal, and the Y coordinates are to be Y1 to Y9.

A quadratic curve passing measurement results $Z(L_1)$, $Z(U_3)$ and $Z(R_1)$ of the best focus positions of the first pair is expressed by $Z=a_1 \cdot X^2 + b_1 \cdot X + c_1$. Herein, although the Y-coordinate value of mark area $MU_3$ is different from those of mark areas $MR_1$ and $ML_1$ in a strict sense, there seem to be no problem when best focus position $Z(U_3)$ of mark area $MU_3$ is considered to substantially match the best focus position of the midpoint of line segment connecting mark areas $MR_1$ and $ML_1$, $Z(U_3)$ is included in the first pair.

A quadratic curve passing measurement results $Z(L_2)$ and $Z(R_2)$ of the best focus positions of the second pair is expressed by $Z=a_2 \cdot X^2 + b_2 \cdot X + c_2$.

Similarly, a quadratic curve passing measurement results $Z(L_j)$ and $Z(R_j)$ of the best focus positions of the $j^{th}$ (j=3 to 8) pair is expressed by $Z=a_j \cdot X^2 + b_j \cdot X + c_j$.

Further, a quadratic curve passing measurement results $Z(L_9)$, $Z(D_3)$ and $Z(R_9)$ of the best focus positions of the $9^{th}$ pair is expressed by $Z=a_9 \cdot X^2 + b_9 \cdot X + c_9$. Herein, $Z(D_3)$ is included in the $9^{th}$ pair for the same reason as $Z(U_3)$ described above.

The 9 quadratic curves are computed in this manner. At this point of time, since the secondary coefficient can be measured only in Y1 and Y9, values between them are interpolated by weighting in accordance with the Y coordinates. Accordingly, a curve on Y2, for example, is expressed by the following equation (1).

[Equation 1]

$$Z(Y2) = \left(a_1 \cdot \frac{Y2-Y9}{Y1-Y9} + a_9 \cdot \frac{Y1-Y2}{Y1-Y9}\right) \cdot X^2 + b_2 \cdot X + c_2 \quad (1)$$

Specifically, the secondary coefficient is computed by interpolation, $b_2$ and $c_2$ are computed based on the fact that they pass measurement values $Z(L_2)$ and $Z(R_2)$.

Moreover, coefficients a, b and c are interpolated to the quadratic curve of the Y coordinates between measured evaluation points in accordance with the Y coordinates. For example, the curve between Y1 and Y2 is expressed in the following equation (2).

[Equation 2]

$$Z(Y) = \left(a_1 \cdot \frac{Y-Y9}{Y1-Y9} + a_9 \cdot \frac{Y1-Y}{Y1-Y9}\right) \cdot X^2 + \left(b_1 \cdot \frac{Y1-Y2}{Y1-Y2} + b_2 \cdot \frac{Y1-Y}{Y1-Y2}\right) \cdot X + \left(c_1 \cdot \frac{Y1-Y2}{Y1-Y2} + c_2 \cdot \frac{Y1-Y}{Y1-Y2}\right) \quad (2)$$

By computing an interpolated curve in accordance with the Y coordinates, the shape of the entire scanning image plane can be expressed as a function to X and Y coordinate positions in reticle R, that is, X and Y coordinate positions of reticle stage RST.

Note that it is also possible to compute distortion distribution based on the projection positions of image position measurement marks $Mx_2$ and $My_2$ of each of mark areas $MU_3$, $ML_1$ to $ML_9$, $MR_1$ to $MR_9$ and $MD_3$ and the design value of each image position measurement mark, in step 426.

After computing the scanning image plane as described above in step 426, the processing of the subroutine of step 212 ends and the procedure returns to step 214 of the main routine in FIG. 6.

In step 214, a difference of the scanning image plane obtained in step 212 with respect to the datum image plane measured in step 210 is computed, and based on the computation result, a correction amount of image-forming characteristics caused by a difference of the pattern surface of reticle R with respect to the datum surface of reticle mark plate RFM, for example, a correction amount of curvature of image plane in accordance with the Y-axis direction position (the Y coordinate) of reticle R is computed. Since illumination area IAR (exposure area IA) has a slit shape in the scanning exposure method, finer correction can be performed by changing the correction amount in accordance with the position (the Y coordinate) of reticle stage RST in the scanning direction.

In the next step, step 216, whether or not the correction amount computed in step 214 above is larger than a predetermined threshold value is judged. The case where the judgment in step 216 is affirmed is a case where a residual error is too large even when the image-forming characteristics are corrected as accurate as possible (i.e. an error state), which is believed to be caused by the case where a foreign object is caught between the platen of reticle stage RST and the reticle, the case where manufacturing error of reticles is large, or the like. Therefore, when the judgment in step 216 is affirmed, the procedure moves to step 224, in which an error message of the foreign object being caught or the like is displayed on the screen of a display (not shown) and an alarm is issued to the operator by sounding alarm sound, and then, operation stops in step 226 (a series of processing of this routine is forcibly terminated).

On the other hand, when the judgment in step 216 is denied, exposure can be performed after the correction of the image-forming characteristics that includes correction to draw the scanning image plane closer to the datum image plane, which becomes necessary due to a difference of the pattern surface of reticle R with respect to the datum surface of reticle mark plate RFM, and therefore, the procedure moves to step 218, in which an exposure operation for printing the circuit pattern of a semiconductor device on a wafer is started. In other words, for example, wafers in 1 lot are sequentially loaded onto Z-tilt stage 38 and scanning exposure is performed to shot areas of each wafer. During the scanning exposure, the correction to draw the scanning image plane closer to the datum image plane is performed by driving the movable lens via image-forming characteristics correction controller 78 in accordance with the Y coordinate of reticle stage RST based on the correction amount of the image-forming characteristics computed in step 214 above and Z-tilt stage 38 is driven via stage controller 70 and wafer stage drive system 56W based on the output from the multipoint focal position detection system (60a, 60b), thereby performing correction so as to draw the surface of wafer W closer to the scanning image plane after the correction, that is, to match them ideally (i.e. the focus leveling control described above is executed).

Note that it is not essential to constantly perform the correction to draw the scanning image plane closer to the datum surface by driving the movable lens, for example, correction of curvature of image plane during scanning exposure, and for example, the correction may be performed prior to scanning exposure. In this case, in the case the focus position is changed due to the driving of the movable lens, main controller 50 may compute a change amount $\Delta Z'$ of the focus position to be generated before scanning exposure, and may execute the above-described focus leveling control during scanning exposure based on a target value of the focus position that is changed only by $-\Delta Z'$. Thus, the curvature of image plane and defocus caused by the deflection of the pattern surface of reticle R are corrected, and the surface of wafer W is highly accurately conformed to the actual image plane of the pattern surface of the reticle R.

In other words, in step 218 above, a primary component of the image plane change in the non-scanning direction (the X-axis direction) is corrected by rolling (X-direction tilt) control of Z-tilt stage 38, a secondary or higher component is corrected by the driving of the movable lens, the image plane change in the scanning direction (the Y-axis direction) is corrected by pitching (Y-direction tilt) control of Z-tilt stage 38, and an offset component of the image plane is corrected by control of a Z-axis direction position of Z-tilt stage 38 (focus control).

Then, the procedure moves to step 220 when the exposure operation to, for example, the wafers in 1 lot ends, and whether or not to continue exposure is judged. Then, in the case the judgment in step 220 is affirmed, the procedure moves to step 222, in which whether or not to replace the reticle is judged.

Herein, since there is no need to measure the scanning image plane again in the case of continuously performing exposure with the same reticle, the procedure returns to step 218 and the same exposure operation as described above is performed. On the other hand, in the case of replacing the reticle, the procedure returns to step 202 and afterward the above-described processing of step 202 and the succeeding steps is repeated.

Meanwhile, in the case the judgment in step 220 is denied, a series of processing of this routine ends.

As is obvious from the foregoing description, in the embodiment, a measurement controller, a computation unit, an object position setting mechanism, and an emergency warning unit are realized by main controller 50, more specifically, by the CPU and the software program. In other words, the measurement controller is realized by the processing of steps 402 to 424 and steps 301 to 320 that the CPU performs, and the computation unit is realized by the processing of steps 322 and 426 that the CPU performs. Further, the object position setting mechanism is realized by the processing of step 218 that the CPU performs, and the emergency warning unit is realized by the processing of steps 216, 224 and 226 that the CPU performs. Further, the correction unit is realized by the processing of step 218 that image-forming characteristics correction controller 78 and the CPU of main controller 50 perform.

As is described above, according to exposure apparatus 10 of the embodiment, main controller 50 as the measurement controller moves reticle stage RST in the scanning direction, illuminates the area including the mark area on reticle R with illumination light IL from the illumination system (12, 14), forms the aerial images of focus marks and the image position measurement marks that exist in the mark area via projection optical system PL, and measures the aerial images using aerial image measuring unit 59, in steps 402 to 424 of FIG. 8. Main controller 50 repeatedly performs such measurement of aerial images while moving reticle stage RST in the scanning direction. Then, main controller 50 as the computation unit computes a scanning image plane on which an image of a pattern formed on reticle R is formed by projection optical system PL based on the measurement result of aerial images of the marks at each movement position, in step 426 of FIG. 8. In the case of the embodiment, since scanning image plane described above is detected instead of the pattern surface itself of the reticle, a sensor for reticle (mask) positional measurement or the like is not necessary. Therefore, it is not necessary to secure an installing space of the sensor for reticle (mask) positional measurement between reticle R and projection optical system PL, the freedom of design for projection optical system PL increases, and a high-performance projection optical system PL can be realized. As a result, high-performance projection optical system PL realizes highly accurate pattern transfer.

Meanwhile, in the case of a scanner such as exposure apparatus 10 of the embodiment, static deformation occurred depending on the position of reticle stage RST (which is the static deformation that is determined and reproduced in accordance with the scanning direction position of reticle stage RST generated due to not dynamic fluctuation but fluctuation of Z-position and tilt associated with the scanning direction positional change of reticle stage RST) is also deformation of the scanning image plane substantially. In the embodiment, not only deformation of the scanning image plane caused by a vacuum suction surface but also deformation of the scanning image plane caused by the reticle stage as described above is corrected.

In the embodiment above, it has been assumed that correction of the scanning image plane with respect to the datum image plane, that is, correction of the image-forming characteristics in the optical axis direction of projection optical system PL is performed and the description has been made for such correction for the purpose of simple description, but the present invention is not limited to this as a matter of course. As is described above, in step 420 of FIG. 8, the projection positions of image position measurement marks $Mx_2$ and $My_2$ at the Z-position same as the best focus position of each of focus measurement marks $Mx_1$ and $My_1$ are stored in the memory as the projection positions of image position measurement marks $Mx_2$ and $My_2$ in the $m^{th}$ mark area being a measurement subject. Therefore, every time when reticle R is replaced, based on a difference between projection positions of corresponding marks in a corresponding mark area, which has been measured for reticle R immediately before the replacement, main controller 50 may compute distortion error and distortion error distribution caused by a difference in a deformation state between a reticle that has been used in exposure immediately before the replacement and a reticle to be used in exposure, and may correct it.

In this case, by driving a part of the movable lenses of projection optical system PL via image-forming characteristics correction controller 78, main controller 50 corrects a distortion component in the non-scanning direction (the X-axis direction) and the magnification component in the X-axis direction and the Y-axis direction. Further, main controller 50 corrects a distortion component in the scanning direction (the Y-axis direction) by adjustment of relative speed of reticle stage RST and wafer stage WST in the Y-axis direction during scan synchronous control, adjustment of relative angular speed of yawing between both stages, or the like.

Incidentally, in the embodiment above, the case has been described where image-forming characteristics correction controller 78 adjusts the Z-position and tilt of a part of a plurality of movable lenses of projection optical system PL. However, the present invention is not limited to this, and the image-forming characteristics correction controller 78 may adjust gas pressure inside an airtight room formed between a part of lens elements or may shift the central wavelength of illumination light IL output from light source 14.

Further, in the embodiment above, the case has been described where in addition to the correction to draw the scanning image plane closer to the datum image plane, the correction to draw the surface of wafer W closer to the corrected scanning image plane. However, the present invention is not limited to this, and main controller 50 may perform only correction to draw the surface of wafer W closer to the scanning image plane measured in the processing in step 212 described above, that is, only the focus leveling control of wafer W.

Further, in the embodiment above, the case has been described where calibration (lens calibration) of the image-forming characteristics of the projection optical system is performed based on the measurement result of the wavefront aberration, however, the present invention is not limited to this. For example, as is disclosed in Kokai (Japanese Unexamined Patent Application Publication) No. 2002-198303 and the corresponding U.S. Patent Application Publication No. 2002/0041377 and the like, plural types of marks for image-forming characteristics (aberration) measurement are formed on reticle mark plate RPM, the aerial images of the marks are severally measured by using aerial image measuring unit 59 with a method disclosed in the above-described publication and the like, and calibration (lens calibration) of the image-forming characteristics of the projection optical system may be performed based on the measurement result. Alternatively, printing on the wafer is performed using a test reticle and calibration of the image-forming characteristics of the projection optical system may be performed based on the printing result. As long as the national laws in designated states (or elected states), to which this international application is applied, permit, the above disclosures of the publication and the U.S. Patent Application Publication are incorporated herein by reference.

Further, in the embodiment above, when the datum image plane is measured in step 210 in FIG. 6, a detection offset at each detection point of the multipoint focal position detection system (60a, 60b) on the datum image plane is obtained, and the focus leveling control described above of wafer W may be performed by taking the offset into consideration, or the incident angle of detection light from irradiation system 60a or the position of a slit image that is re-formed in photodetection system 60b may be shifted so as to cancel the offset.

Further, in the embodiment above, the case has been described where the datum image plane is a plane on which the datum surface of reticle mark plate RFM is projected by projection optical system PL. However, the present invention is not limited to this, and the datum image plane may be a horizontal plane. In such a case, step 210 described above can be omitted.

In the case a reticle, which has been used as a reticle before and in which the measurement data of the scanning image plane has been stored, is used and required accuracy of its exposure process is not very high, the measurement process of the scanning image plane in step 212 described above can be omitted to increase throughput.

Further, in the embodiment above, the case has been described where horizontal direction slit scanning at a plurality of z-positions is performed when the best focus position is obtained by measuring the aerial images of the evaluation mark and the measurement marks, but aerial image measurement by Z scanning described below may also be performed.

Specifically, in a state where main controller 50 detects a projection position of a focus measurement mark (an isolated line) by the horizontal scanning described above, and the position of Z-tilt stage 38 is set in the XY plane so that an x-position (or a Y-position) of the projection center of the projected image (the aerial image) of the mark matches an X-position (or a Y-position) of the center of slit 122x (or 122y) of slit plate 90, main controller 50 moves Z-tilt stage 38 in the optical axis AX direction (the Z-axis direction) within a predetermined moving range (i.e. performs Z scanning) via stage controller 70 and wafer stage drive system 56W while illuminating the mark area of reticle R mounted on reticle stage RST with illumination light IL from the illumination system (12, 14), obtains position data of Z-tilt stage 38 in the Z-axis direction that is obtained based on the output from the multipoint focal position detection system (60a, 60b) and intensity data of an output signal from optical sensor 124 that is input via signal processing unit 80, at predetermined sampling intervals during the Z scanning. At this point of time, by using the initial position described above as a movement center, main controller 50 moves Z-tilt stage 38 within a range of a predetermined width having the movement center as a center, while monitoring the output from the multipoint focal position detection system (60a, 60b).

Then, by a slice method using one or a plurality of slice levels, the best focus position of projection optical system PL is computed. Herein, the slice method is a method where the midpoint of two intersections of the change curve of slit transmitted light intensity obtained during z scanning with the slice level is obtained and a Z-position of the midpoint is used as the best focus position. For example, when using a plurality of slice levels, the midpoints between two each intersections of the change curve of the slit transmitted light intensity and each slice level (the midpoint of line segment determined by two each of intersections) are severally computed, and the average value of the plurality of midpoints may be used as the best focus position. Note that sensor gain needs to be properly adjusted near the above-described movement center in the case of computing the best focus position by Z scanning.

Meanwhile, in the embodiment above, the case has been described where the scanning image plane is expressed by a plurality of quadric functions and the shape of the scanning image plane is computed using the functions, but it goes without saying that the present invention is not limited to this. For example, as is shown in FIG. 12, the scanning image plane may be expressed by using a plurality of linear functions and the shape of the scanning image plane may be computed using the functions.

Figure 12:
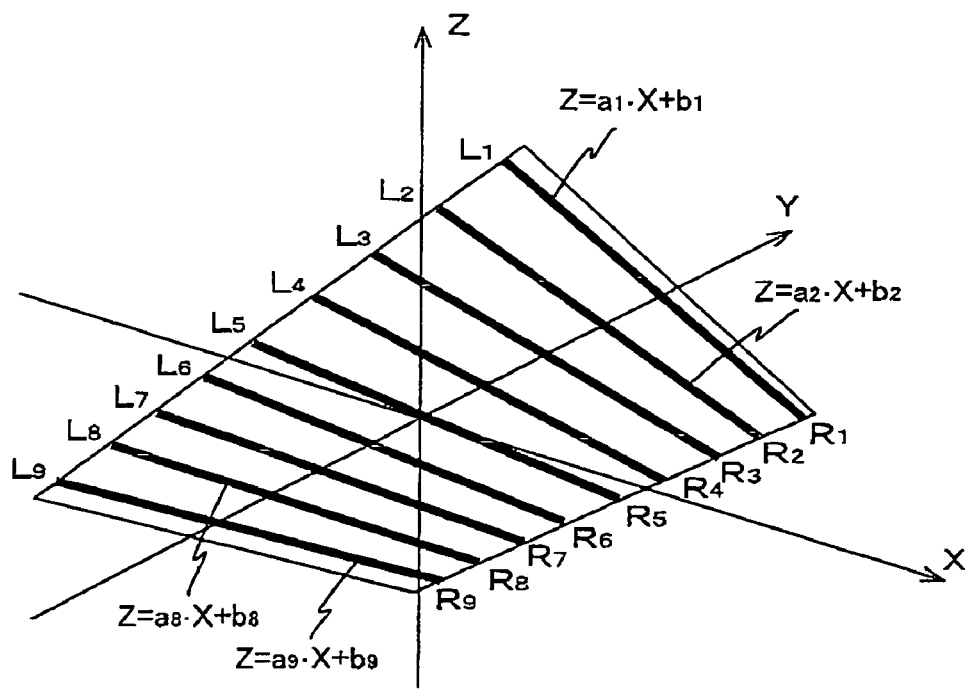
FIG. 12 is a view for explaining another computation method of the scanning image plane.

FIG. 12 shows 9 pairs of measurement points ($L_1$, $R_1$) to ($L_9$, $R_9$) in the Y-axis direction. Their Y coordinates are to be Y1 to Y9. A straight line passing the measurement results $Z(L_1)$ and $Z(R_1)$ of the best focus position of the first pair is expressed by $Z=a_1 \cdot X+b_1$. A straight line passing measurement results $Z(L_2)$ and $Z(R_2)$ of the best focus position of the second pair is expressed by $Z=a_2 \cdot X+b_2$. The 9 straight lines are computed in this manner. Regarding the straight lines between them, for example, between ($Z=a_1 \cdot X+b_1$) and ($Z=a_2 \cdot X+b_2$), coefficients $a_1$ and $b_1$ may be interpolated in accordance with the Y coordinates.

Specifically, the straight line between Y1 and Y2 is expressed as in the following equation (3).

[Equation 3]

$$Z(Y) = \left(a_1 \cdot \frac{Y-Y2}{Y1-Y2} + a_2 \cdot \frac{Y1-Y}{Y1-Y2}\right) \cdot X + \left(b_1 \cdot \frac{Y-Y2}{Y1-Y2} + b_2 \cdot \frac{Y1-Y}{Y1-Y2}\right) \quad (3)$$

By computing interpolated line in accordance with Y coordinates in this manner, the entire shape of the scanning image plane can be expressed by function. This method is suitable for the case where reticle R has deformation of a twisted shape, or the like.

Moreover, in the case of expressing the scanning image plane in a plurality of cubic or higher-order functions, the number of mark areas to be measured (the number of measurement points) out of mark areas located on both sides of pattern area PA in the scanning direction only has to be increased.

In addition, it is also possible that an arbitrary function z=f(X,Y) including a predetermined number of parameters is assumed, each of the parameters in function f is fitted by using a statistical method such as the least-squares method based on a Z measurement result of the scanning image plane at each position (X, Y), and the scanning image plane shape is expressed by this function f.

For example, in the case the vacuum suction portion in the reticle pattern surface is arranged on both end portions in the X-axis direction on the reticle, since the reticle pattern surface itself is easily deformed along the central portion in the X-axis direction of the reticle into a saddle shape which saddle portion is a portion extending in the Y-axis direction, it is desirable that function f is made up of a function and parameters capable of expressing the saddle shape.

Even when the vacuum suction portion in the reticle pattern surface is a portion having another shape, it is preferable to use a function made up of a function and parameters capable of expressing a shape that is easily deformed according to the vacuum suction surface shape.

In any case, a function for determining the shape of the scanning image plane is preferably determined by, for example, referring to a deformation shape obtained by an FEM (Finite Element Method) simulation, assuming the above-described vacuum suction portion shape. Alternatively, it may be determined by referring to a reticle flatness level measurement result or the like.

Meanwhile, in the embodiment above, the case has been described where reticle mark plate RFM is used as a datum member, but the present invention is not limited to this. A test reticle that has a vacuum suction surface having good flatness level may be used. In such a case, since the datum image plane becomes the scanning image plane of the pattern surface of the test reticle, a more appropriate datum image plane where even a vacuum suction state is taken into consideration is realized.

In the embodiment above, when measuring the scanning image plane using the mark areas formed on both ends of reticle R in the X-axis direction, each blade is fully opened so that a width of the opening of movable reticle blind 30B in the non-scanning direction becomes the maximum, and illumination light is irradiated on the mark areas. On the other hand, when exposing the circuit pattern on the wafer, each blade is closed so that a width of the opening of movable reticle blind 30B in the non-scanning direction substantially matches a width of the light-shielding band, and irradiation of illumination light on the mark areas (the measurement marks) (error transfer on wafer) is prevented.

Meanwhile, in the embodiment above, the measurement pattern (the measurement marks) on reticle R may be a phase shift pattern (a phase shift reticle) of a spatial frequency modulation type or may be a phase shift pattern of a halftone type or shifter light-shielding type.

Further, in the embodiment above, circuit pattern area PA exists on the central portion on the pattern surface of reticle R, and the mark areas exist only around the pattern area. However, for example, in the case the circuit pattern on the reticle is composed of patterns corresponding to a plurality of chips, it becomes possible to place a pattern other than the circuit pattern on a boundary portion of an area corresponding to each chip in some cases. In such cases, mark areas similar to the ones described above are placed also on the boundary portion, measurement of positions (Z-positions) of images of the measurement marks in the mark areas are also performed, and estimation of the scanning image plane may be performed using the result as well. In such cases, the accuracy of estimation of the scanning image plane can be improved even more.

Incidentally, in the case a width of the boundary portion is smaller than the size of the above-described mark area (60 μm square on wafer), the shape of mark areas to be placed on the boundary portion may be reduced in size. As an example of reduction in size, instead of the measurement marks in the mark area shown in FIG. 10, it is also possible to use only one of a mark that has only patterns having longitudinal direction in the X-axis direction and a mark that has only patterns having longitudinal direction in the Y-axis direction. Further, in the case where such a mark may be transferred onto a wafer, in other words, in the case the mark may be formed on a part of a semiconductor integrated circuit, it goes without saying that the measurement marks can be placed in the circuit pattern and used in estimation of the scanning image plane.

Note that the magnification of the projection optical system in the exposure apparatus in the embodiment above may be not only a reduction system but also either an equal magnifying system or a magnifying system, and projection optical system PL may be not only a dioptric system but also either a catoptric system or a catadioptric system, and the projected image may be either an inverted image or an upright image.

Further, in the embodiment above, the case has been described where KrF excimer laser light or ArF excimer laser light is used as illumination light IL. However, the present invention is not limited to this, and light having a wavelength of 170 nm or less, for example, another vacuum ultraviolet light such as $F_2$ laser light (wavelength: 157 nm) and $Kr_2$ laser light (wavelength: 146 nm) may be used.

Further, the vacuum ultraviolet light is not limited to the above-described laser light output from each light source, and for example, a harmonic wave may also be used that is obtained by amplifying a single-wavelength laser beam in the infrared or visible range emitted by a DFB semiconductor laser or fiber laser, with a fiber amplifier doped with, for example, erbium (Er) (or both erbium and ytteribium (Yb)), and by converting the wavelength into ultraviolet light using a nonlinear optical crystal.

Further, in the embodiment above, it goes without saying that not only light having a wavelength of 100 nm or more but also light having a wavelength of less than 100 nm may be used as illumination light IL of the exposure apparatus. For example, in recent years, in order to expose a pattern of 70 nm or less, development is performed of an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask. In the EUV exposure apparatus, the arrangement in which scanning exposure is performed by synchronously scanning a mask and a wafer using circular arc illumination can be considered, therefore the present invention can be suitably applied to such an apparatus. Furthermore, for example, the present invention can also be suitably applied to a liquid immersion exposure apparatus that has liquid (such as pure water) filled in between projection optical system PL and a wafer whose details are disclosed in, for example, the pamphlet of International Publication No. WO99/49504 and the pamphlet of International Publication No. WO 2004/053955, and the like. In this case, a function that fills liquid such as water between the projection optical system and the wafer (and the slit plate of the aerial image measuring unit) is installed. In the liquid immersion exposure apparatus, numerical aperture NA of the projection optical system (=sine of aperture angle of image-forming beam x refractive index of liquid) exceeds 1 in some cases, so that it is desirable that the liquid immersion exposure apparatus has a configuration in which beams having NA of 1 or more can be received by filling a part of the aerial image measuring unit with liquid when necessary. Further, in the case of applying the present invention to the liquid immersion exposure apparatus, the case where a focal point detection system of an oblique incident method cannot be placed due to a short working distance on the wafer side could occur. In this case, a capacitive sensor or a positional sensor of a water pressure sensing type can be used as the focal point detection system.

Incidentally, in the embodiment above, at least a part of aerial image measuring unit 59 is arranged in Z-tilt stage 38 mounting wafer W thereon, but a position where the aerial image measuring unit is placed is not limited to this.

For example, a measurement stage movable on wafer base 16 in XY-directions is arranged in addition to Z-tilt stage 38 mounting wafer W thereon and wafer stage WST, and all or a part of the aerial image measuring unit can be arranged on the measurement stage. This case has an advantage that wafer stage WST can be made smaller and lighter by omitting aerial image measuring unit 59 and the controllability of wafer stage WST can be further improved.

The position of the measurement stage is measured by the laser interferometer in a similar manner to wafer stage WST, and the position is controlled highly accurately in the X-axis direction and the Y-axis direction based on the measurement result. Further, the position in the Z-axis direction is also controlled highly accurately based on the output from the multipoint focal position detection system (60a, 60b). Therefore, the scanning image plane still can be measured highly accurately in this case as well similarly to the embodiment above.

Note that the illumination optical system and the projection optical system, which are constituted by a plurality of lenses, are assembled into the exposure apparatus main section and optical adjustment is performed, the reticle stage and the wafer stage, which are composed of a large number of mechanical parts, are attached to the exposure apparatus main section and the wiring and piping are connected, total adjustment (such as electrical adjustment and operational check) is further performed, and thus the exposure apparatus of the embodiment above can be manufactured. Meanwhile, it is desirable that the exposure apparatus is manufactured in a clean room whose temperature, cleanness and the like are controlled.

Note that the present invention is not limited to the exposure apparatus for manufacturing semiconductor devices, but can also be applied to exposure apparatuses such as an exposure apparatus used for manufacturing displays including liquid crystal display devices or the like that transfers a device pattern onto a glass plate, an exposure apparatus used for manufacturing thin film magnetic heads that transfers a device pattern onto a ceramic wafer, an exposure apparatus used for manufacturing imaging devices (such as CCDs), micromachines, organic EL, DNA chips or the like. Further, the present invention can also be applied to an exposure apparatus that transfers a circuit pattern onto a glass substrate, a silicon wafer or the like not only when manufacturing microdevices such as semiconductor devices, but also when manufacturing a reticle or a mask used in an optical exposure apparatus, an EUV exposure apparatus, an X-ray exposure apparatus, an electron beam exposure apparatus and the like. Herein, a transmissive reticle is generally used in an exposure apparatus that uses DUV (deep ultraviolet) light, VUV (vacuum ultraviolet) light or the like, and silica glass, fluorine-doped silica glass, fluorite, magnesium fluoride, or crystal or the like is used as a reticle substrate. Further, a transmissive mask (a stencil mask, a membrane mask) is used in an X-ray exposure apparatus by a proximity method, an electron beam exposure apparatus or the like, and a silicon wafer or the like is used as a mask substrate.

<<Device Manufacturing Method>>

Figure 13:
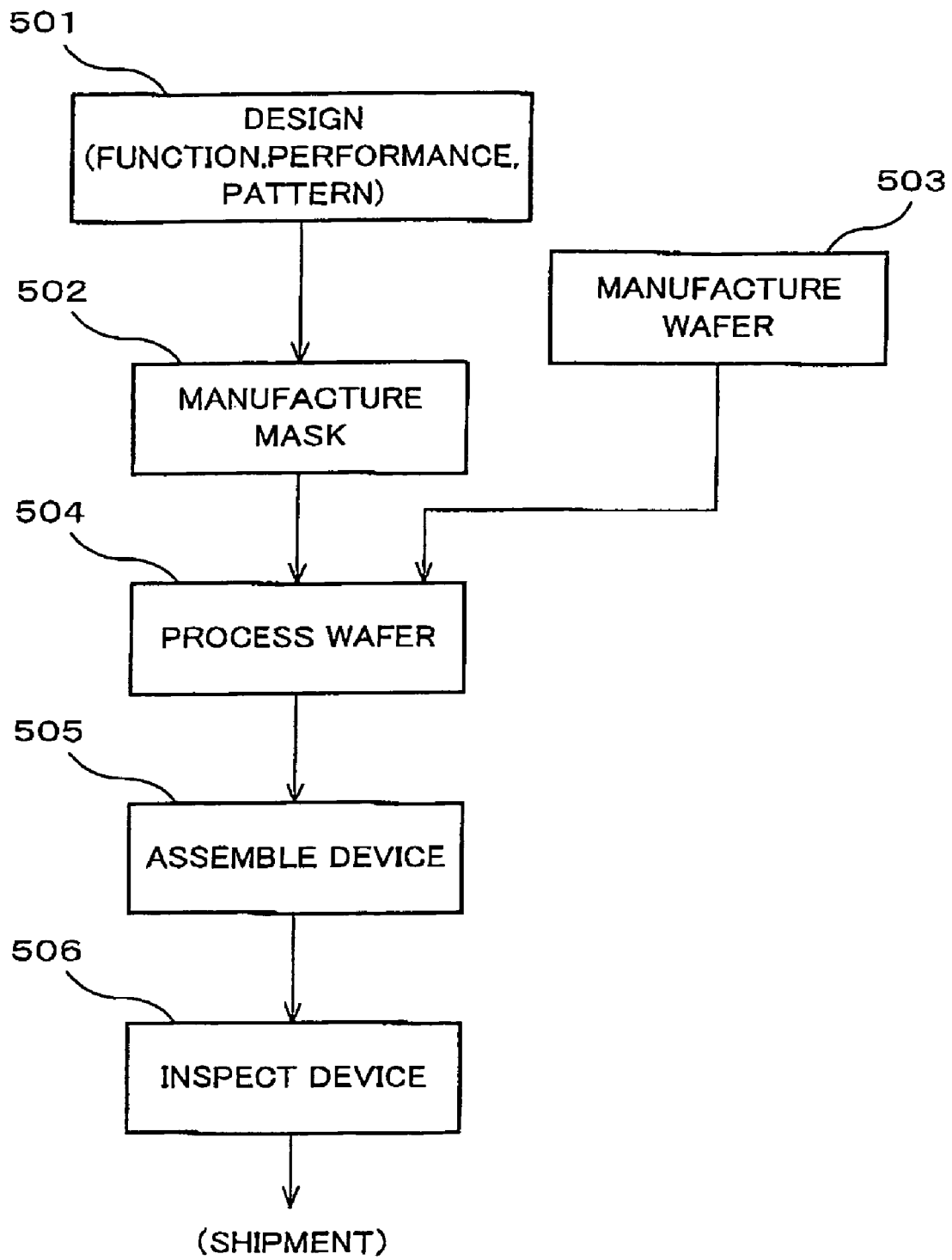
FIG. 13 is a flowchart for explaining an embodiment of a device manufacturing method according to the present invention.

FIG. 13 shows a flowchart of an example when manufacturing a device (a semiconductor chip such as an IC or an LSI, a liquid crystal panel, a CCD, a thin film magnetic head, a micromachine, and the like). As is shown in FIG. 13, first of all, in step 501 (design step), function and performance design of device (such as circuit design of semiconductor device) is performed, and pattern design to realize the function is performed. Then, in step 502 (mask manufacturing step), a mask on which the designed circuit pattern is formed is manufactured. Meanwhile, in step 503 (wafer manufacturing step), a wafer is manufactured using materials such as silicon.

Next, in step 504 (wafer processing step), the actual circuit and the like are formed on the wafer by lithography or the like in a manner that will be described later, using the mask and the wafer prepared in steps 501 to 503. Then, in step 505 (device assembly step), device assembly is performed using the wafer processed in step 504. Step 505 includes processes such as the dicing process, the bonding process, and the packaging process (chip encapsulation), and the like when necessary.

Finally, in step 506 (inspection step), tests on operation, durability, and the like are performed on the devices made in step 505. After these steps, the devices are completed and shipped out.

Figure 14:
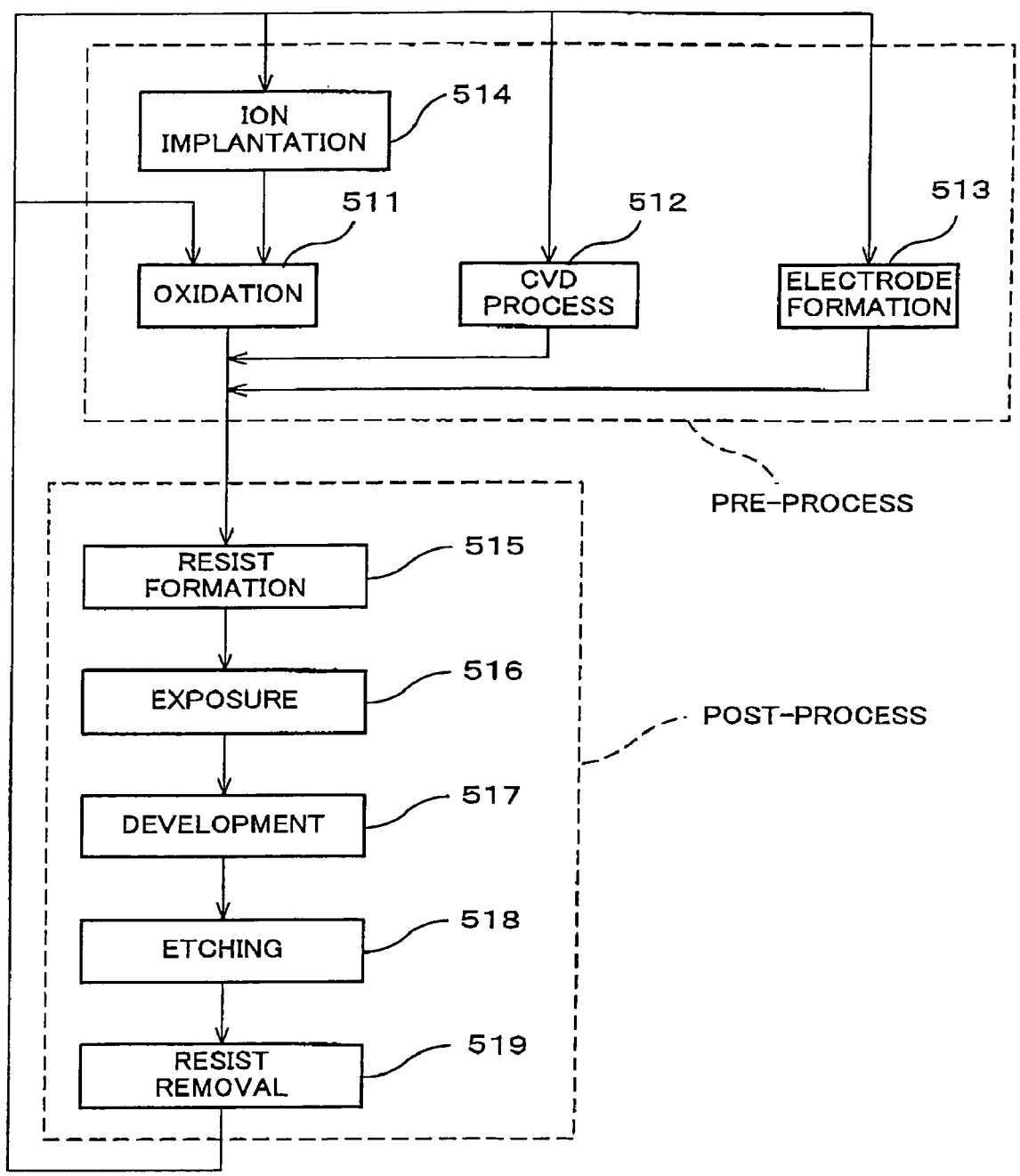
FIG. 14 is a flowchart showing the details of step 504 in FIG. 13.

FIG. 14 is a flow chart showing a detailed example of step 504 described above. Referring to FIG. 14, in step 511 (oxidation step), the surface of wafer is oxidized. In step 512

(CDV step), an insulating film is formed on the wafer surface. In step 513 (electrode formation step), an electrode is formed on the wafer by deposition. In step 514 (ion implantation step), ions are implanted into the wafer. Each of the above steps 511 to 514 constitutes the pre-process in each step of wafer processing, and the necessary processing is chosen and is executed at each stage.

When the above-described pre-process ends in each stage of wafer processing, post-process is executed as follows. In the post-process, first in step 515 (resist formation step), a photosensitive agent is coated on the wafer. Then, in step 516 (exposure step), the circuit pattern of the mask is transferred onto the wafer by the exposure apparatus and the exposure method described above. Next, in step 517 (development step), the wafer that has been exposed is developed, and in step 518 (etching step), an exposed member of an area other than the area where resist remains is removed by etching. Then, in step 519 (resist removing step), when etching is completed, the resist that is no longer necessary is removed.

By repeatedly performing the pre-process and the post-process, multiple circuit patterns are formed on the wafer.

by using the device manufacturing method of the embodiment described above, because the exposure apparatus in the embodiment above and the exposure method thereof are used in the exposure step (step 516), a pattern of a reticle can be transferred onto a wafer with high accuracy, and as a consequence, the productivity (including the yield) of highly integrated microdevices can be improved.

INDUSTRIAL APPLICABILITY

The image plane measurement method of the present invention is suitable for measuring a scanning image plane, on which an image of a pattern formed on a mask mounted on a mask stage movable in a predetermined scanning direction is formed by a projection optical system. Further, the exposure method and the exposure apparatus of the present invention are suitable for transferring the pattern onto an object. Further, the device manufacturing method of the present invention is suitable for manufacturing microdevices.

What is claimed is:

1. An image plane measurement method in which a scanning image plane, on which an image of a pattern formed on a mask mounted on a mask stage that is movable in a predetermined scanning direction is formed by a projection optical system, is measured, the method comprising:
   moving the mask stage in the scanning direction;
   at each movement position to which the mask stage moves, forming an aerial image of at least one mark formed in a mark area of the mask illuminated with an illumination light, via the projection optical system;
   measuring the aerial image of the mask using an aerial image measuring device; and
   computing the scanning image plane based on the measurement result of the aerial image of the mark at the each movement position.

2. The image plane measurement method according to claim 1 wherein
   the measuring the aerial image includes:
   measurement of positional information on the aerial image of the mark in an optical axis direction of the projection optical system, and
   measurement of positional information on the aerial image of the mark in a direction within a plane perpendicular to an optical axis of the projection optical system.

3. The image plane measurement method according to claim 1 wherein
   the mask has a plurality of the mark areas that are arranged at least one of inside and outside a rectangular-frame-shaped light-shielding band that partitions a pattern area on which the pattern is formed.

4. The image plane measurement method according to claim 3 wherein
   the mask has plural pairs of the mark areas that are severally placed along a pair of facing sides parallel with the scanning direction of the rectangular-frame-shaped light-shielding band.

5. The image plane measurement method according to claim 4 wherein
   the mask has at least one each of the mark area that is placed near each of a remaining pair of facing sides of the rectangular-frame-shaped light-shielding band.

6. An exposure method in which a mask stage on which a mask is mounted and an object are synchronously moved with respect to illumination light and a pattern formed on the mask is transferred onto the object, the method comprising:
   measuring a scanning image plane on which an image of a pattern formed on the mask is formed by a projection optical system, by an image plane measurement method in which a scanning image plane, on which an image of a pattern formed on a mask mounted on a mask stage that is movable in a predetermined scanning direction is formed by a projection optical system, is measured, wherein
   the method comprises:
   moving the mask stage in the scanning direction;
   at each movement position to which the mask stage moves, forming an aerial image of at least one mark formed in a mark area of the mask illuminated with an illumination light, via the projection optical system;
   measuring the aerial image of the mask using an aerial image measuring device;
   computing the scanning image plane based on the measurement result of the aerial image of the mark at the each movement position; and
   performing correction so as to draw the scanning image plane and a surface of the object closer to each other based on the measurement result of the scanning image plane, when the pattern is transferred.

7. The exposure method according to claim 6 wherein
   the mask has the mark areas, and the mark areas are severally arranged at a plurality of positions that are on the periphery of a pattern area on the mask to be transferred onto the object and are away from the pattern area at a predetermined distance or more.

8. The exposure method according to claim 7 wherein
   the pattern area is defined by a pair of first facing sides substantially parallel with the scanning direction, and the mark areas are severally arranged at a plurality of positions that are near the pair of first facing sides and are away from the pattern area at a predetermined distance or more.

9. The exposure method according to claim 8 wherein
   the pattern area is defined by a pair of second facing sides that are substantially parallel with each other and orthogonal to the scanning direction, and the mark areas are arranged in at least one position that is near the pair of second facing sides and is away from the pattern area at a predetermined distance or more.

10. The exposure method according to claim 7 wherein
   a light-shielding band is arranged in at least a part of an area between the pattern area and the mark area on the mask.

11. The exposure method according to claim 6 wherein
   the mark areas are formed on a predetermined band-shaped area that is parallel with or orthogonal to the scanning direction in the pattern area.

12. The exposure method according to claim 6, further comprising:
measuring at least one of a position and a shape of the surface of the object onto which the pattern is transferred, at the time of the transfer or prior to the transfer.

13. The exposure method according to claim 6, further comprising:
correcting the scanning image plane so as to draw the scanning image plane closer to a known datum image plane based on the measurement result of the scanning image plane, when the pattern is transferred.

14. The exposure method according to claim 13 wherein the datum image plane is a flat surface.

15. The exposure method according to claim 13 wherein the datum image plane is a formation plane on which projected images of a plurality of marks formed on a datum surface of a datum member that exists on the mask stage are formed, the projected image being projected by the projection optical system.

16. The exposure method according to claim 15, further comprising:
prior to the correcting the scanning image plane, illuminating the datum member on the mask stage with illumination light, forming aerial images of a plurality of marks on the datum member via the projection optical system, measuring the aerial images using an aerial image measuring device, and computing the datum image plane based on the measurement result.

17. The exposure method according to claim 13, further comprising:
a judgment process in which judging whether or not to perform the correction of the scanning image plane based on the measurement result of the scanning image plane and the datum image plane.

18. A device manufacturing method, comprising:
a lithography process in which the pattern is transferred onto an object by an exposure method in which a mask stage on which a mask is mounted and an object are synchronously moved with respect to illumination light and a pattern formed on the mask is transferred onto the object, the method comprises:
measuring a scanning image plane on which an image of a pattern formed on the mask is formed by a projection optical system, by an image plane measurement method in which a scanning image plane, on which an image of a pattern formed on a mask mounted on a mask stage that is movable in a predetermined scanning direction is formed by a projection optical system, is measured, wherein
the method comprises:
moving the mask stage in the scanning direction;
at each movement position to which the mask stage moves, forming an aerial image of at least one mark formed in a mark area of the mask illuminated with an illumination light, via the projection optical system;
measuring the aerial image of the mask using an aerial image measuring device;
computing the scanning image plane based on the measurement result of the aerial image of the mark at the each movement position; and
performing correction so as to draw the scanning image plane and a surface of the object closer to each other based on the measurement result of the scanning image plane, when the pattern is transferred.

19. A device manufacturing method, comprising:
a lithography process in which the pattern is transferred onto an object by an exposure method in which a mask stage on which a mask is mounted and an object are synchronously moved with respect to illumination light and a pattern formed on the mask is transferred onto the object, the method comprises:
measuring a scanning image plane on which an image of a pattern formed on the mask is formed by a projection optical system, by an image plane measurement method in which a scanning image plane, on which an image of a pattern formed on a mask mounted on a mask stage that is movable in a predetermined scanning direction is formed by a projection optical system, is measured, wherein
the method comprises:
moving the mask stage in the scanning direction;
at each movement position to which the mask stage moves, forming an aerial image of at least one mark formed in a mark area of the mask illuminated with an illumination light, via the projection optical system;
measuring the aerial image of the mask using an aerial image measuring device;
computing the scanning image plane based on the measurement result of the aerial image of the mark at the each movement position;
performing correction so as to draw the scanning image plane and a surface of the object closer to each other based on the measurement result of the scanning image plane, when the pattern is transferred;
correcting the scanning image plane so as to draw the scanning image plane closer to a known datum image plane based on the measurement result of the scanning image plane, when the pattern is transferred; and
judging whether or not to perform the correction of the scanning image plane based on the measurement result of the scanning image plane and the datum image plane.

20. An exposure apparatus that synchronously moves a mask and an object in a predetermined scanning direction and transfers a pattern formed on the mask onto the object, the apparatus comprising:
a mask stage that holds the mask and is movable in at least the scanning direction;
an illumination system that illuminates the mask with illumination light;
a projection optical system that projects the pattern formed on the mask;
an aerial image measuring device that measures a projected image formed by the projection optical system;
an object stage that holds the object and moves;
a measurement controller connected to the mask stage and the aerial image measuring device, which moves the mask stage in the scanning direction, and at each movement position of the mask stage, measures an aerial image of at least one mark formed in a mark area of the mask that is illuminated with an illumination light from the illumination system, via the projection optical system, using the aerial image measuring device; and
a computation device that computes a scanning image plane on which an image of a pattern formed on the mask is formed by the projection optical system, based on the measurement result of the aerial image of the mark at the each movement position.

21. The exposure apparatus according to claim 20 wherein the scanning image plane is computed by performing statistical processing of the measurement result by the measurement controller of the aerial images of a plurality and discrete marks that are arranged at least one of inside and outside the pattern formed on the mask.

22. The exposure apparatus according to claim 20, further comprising:
an object position setting mechanism that sets a position of the object so as to draw the scanning image plane and a surface of the object closer to each other based on the computation result of the scanning image plane.

23. The exposure apparatus according to claim 20, further comprising:
an object position measurement mechanism that measures one of positional information and shape information on the surface of the object.

24. The exposure apparatus according to claim 20 wherein the measurement controller has a mechanism that measures positional information on the projected image of the mark in an optical axis direction of the projection optical system, and a mechanism that measures positional information on the projected image of the mark in a direction within a plane perpendicular to the optical axis, and
the computation device has a function that computes an image plane based on positional information on the projected image of the mark in the optical axis direction at the each movement position, and a function that computes distortion distribution based on positional information on the projected image of the mark in a direction within a plane perpendicular to the optical axis at the each movement position.

25. The exposure apparatus according to claim 20, further comprising:
a correction device that corrects the scanning image plane so as to draw the scanning image plane closer to a known datum image plane based on the computation result of the scanning image plane by the computation device, when the pattern is transferred.

26. The exposure apparatus according to claim 25 wherein the datum image plane is a flat surface.

27. The exposure apparatus according to claim 25 wherein the datum image plane is a formation plane on which projected images of a plurality of marks formed on a datum surface of a datum member that exists on the mask stage are formed by the projection optical system.

28. The exposure apparatus according to claim 25 wherein prior to correction by the correction device, the measurement controller illuminates the datum member on the mask stage with the illumination light from the illumination system, forms aerial images of the plurality of marks via the projection optical system, and measures the aerial images using the aerial image measuring device, and
the computation device computes the datum image plane based on the measurement result.

29. The exposure apparatus according to claim 25, further comprising:
an emergency warning device that judges whether or not an error state occurs based on the computation result of the scanning image plane by the computation device and the datum image plane, and in the case the error state occurs, notifies occurrence of the error state to the outside and stops operation of the apparatus.

30. The exposure apparatus according to claim 20, further comprising:
a movable stage on which at least a part of the aerial image measuring device is arranged and which is different from the object stage.

* * * * *